United States Patent
Terasawa et al.

(10) Patent No.: US 8,435,702 B2
(45) Date of Patent: May 7, 2013

(54) MANUFACTURING METHOD OF SEMICONDUCTOR DEVICE AND MANUFACTURING METHOD OF MASK

(75) Inventors: Tsuneo Terasawa, Tokyo (JP); Takeshi Yamane, Tsukuba (JP)

(73) Assignees: Renesas Electronics Corporation, Kawasaki-shi (JP); Kabushiki Kaisha Toshiba, Tokyo (JP)

( * ) Notice: Subject to any disclaimer, the term of this patent is extended or adjusted under 35 U.S.C. 154(b) by 759 days.

(21) Appl. No.: 12/563,265

(22) Filed: Sep. 21, 2009

(65) Prior Publication Data

US 2010/0080647 A1    Apr. 1, 2010

(30) Foreign Application Priority Data

Sep. 30, 2008   (JP) .................. 2008-254046

(51) Int. Cl.
*G03F 1/00*     (2012.01)
(52) U.S. Cl.
USPC ........... 430/5; 430/22; 430/311; 430/325; 430/396; 250/504 R; 355/67
(58) Field of Classification Search ........ 355/55, 355/67, 69; 359/359, 584, 587; 372/32; 378/34, 35, 84; 430/311, 5
See application file for complete search history.

(56) References Cited

U.S. PATENT DOCUMENTS

| | | | |
|---|---|---|---|
| 5,328,784 A * | 7/1994 | Fukuda | 430/5 |
| 6,607,952 B1 * | 8/2003 | Yagishita et al. | 438/216 |
| 7,170,683 B2 | 1/2007 | Sugawara | |
| 2003/0003383 A1 * | 1/2003 | Van Der Werf et al. | 430/22 |
| 2006/0099517 A1 | 5/2006 | Sugawara | |
| 2007/0181834 A1 * | 8/2007 | Kleinschmidt | 250/504 R |

FOREIGN PATENT DOCUMENTS

| | | |
|---|---|---|
| JP | 4118914 A | 4/1992 |
| JP | 11305417 A | 11/1999 |
| JP | 2003-315532 A | 11/2003 |
| JP | 2004-096063 A | 3/2004 |
| JP | 2006-179553 A | 7/2006 |

OTHER PUBLICATIONS

Office Action dated Sep. 4, 2012 in Japanese Patent Application 2008-254046.

* cited by examiner

*Primary Examiner* — Duy Deo
*Assistant Examiner* — Erin Bergner
(74) *Attorney, Agent, or Firm* — Miles & Stockbridge P.C.

(57) ABSTRACT

Provided is a technique capable of improving the dimensional accuracy of a transfer pattern in a lithography technique in which EUV light is used and the EUV light is incident obliquely on a mask and an image of the EUV light reflected from the mask is formed on a semiconductor substrate (resist film), thereby transferring the pattern formed on the mask onto the semiconductor substrate. The present invention is based on a lithography technique in which EUV light is used and an exposure optical system in which the EUV light is obliquely incident on a mask is used. In this lithography technique, an absorber and a difference in level are formed on the mask, and a projective component projected on a mask surface out of a direction cosine component of the incident light is set to be almost orthogonal to an extending direction of the difference in level.

14 Claims, 27 Drawing Sheets

MANUFACTURING METHOD OF SEMICONDUCTOR DEVICE AND MANUFACTURING METHOD OF MASK

CROSS-REFERENCE TO RELATED APPLICATION

The present application claims priority from Japanese Patent Application No. JP 2008-254046 filed on Sep. 30, 2008, the content of which is hereby incorporated by reference into this application.

TECHNICAL FIELD OF THE INVENTION

The present invention relates to a technique for manufacturing a semiconductor device and a technique for manufacturing a mask. More particularly, it relates to a technique effectively applied to a photolithography technique using extreme ultra violet (hereinafter, referred to as EUV light) in a manufacturing process of a semiconductor device.

BACKGROUND OF THE INVENTION

Japanese Patent Application Laid-Open Publication No. 2004-96063 (Patent Document 1) describes a technique for providing a phase shift mask of EUV light that can be actually realized by obtaining an appropriate combination of a refractive index and an absorption coefficient even when reflecting the EUV light. More specifically, a phase shift mask is formed by providing a reflective multilayer film substrate which reflects the EUV light and first and second regions formed on the reflective multilayer film substrate. First, with respect to an arbitrary complex refractive index for EUV light and an arbitrary film thickness, a phase and a reflectance of a reflection light of the EUV light obtained from the complex refractive index and the film thickness are specified. Then, based on the specified result, the film thickness and the complex refractive index of each of the film formed in the first region and the film formed in the second region are set so that a predetermined phase difference occurs between the reflection light of the EUV light in the first region and the reflection light of the EUV light in the second region.

In the technique described in Japanese Patent Application Laid-Open Publication No. 2003-315532 (Patent Document 2), the wavelength dependency of reflectance when the EUV light goes through a plurality of reflecting surfaces is controlled to match with the exposure center wavelength of the EUV light, thereby sufficiently ensuring the energy reaching an object to be exposed. More specifically, the reflector of the EUV light used for the exposure to the object to be exposed by the EUV light in the photolithography process for manufacturing a semiconductor device is formed to have a multilayer film structure obtained by repeatedly stacking a plurality of layers in the same order. At this time, the cycle length in units of the repetitive stacking in the multilayer film structure is set so that the half-width center of the reflectance when the EUV light goes through a predetermined number of reflectors and the center wavelength of the EUV light to be reflected are matched.

In the technique described in Japanese Patent Application Laid-Open Publication No. 2006-179553 (Patent Document 3), with respect to an EUV mask in which a first multilayer film to be a high-reflection portion of an exposure light and a first protection film are formed on a substrate, a second multilayer film to be another high-reflection portion and a second protection film are formed thereon, and a pattern made from an intermediate film formed between the first protection film and the second multilayer film is formed, phase difference and intensity of reflection light are precisely determined in accordance with a material of the intermediate film. More specifically, from the characteristics of the reflectance of the first multilayer film and the first protection film and the reflectance of the second multilayer film and the second protection film for the thickness of the intermediate film and the characteristics of the phase difference between the reflection light by the first multilayer film and the first protection film and the reflection light by the second multilayer film and the second protection film for the thickness of the intermediate film, the thickness of the intermediate film is set so that the reflectances are equal to each other and the phase difference becomes 180 degrees.

SUMMARY OF THE INVENTION

A semiconductor device is formed by repeatedly using the photolithography technique, which irradiates exposure light to a mask having a circuit pattern drawn thereon to transfer the circuit pattern formed on the mask onto a semiconductor substrate (semiconductor wafer) through a reduction optical system.

In recent years, the scaling down of semiconductor devices has been proceeding, and the technique for improving the resolution by shortening the wavelength of the exposure light used in the photolithography technique has been studied. For example, the ArF lithography technique using argon fluoride (ArF) excimer laser light with the wavelength of 193 nm has been developed so far, and the lithography technique using the EUV light with the much shorter wavelength of 13.5 nm (EUVL (Extreme Ultra Violet Lithography)) has been under development.

In the usual photolithography technique, the exposure light is transmitted through the mask having the circuit pattern formed thereon, thereby transferring the pattern formed on the mask onto a semiconductor substrate. That is, the mask is made of a transparent material that transmits the exposure light, and a desired circuit pattern is formed on the mask by forming a light-shielding pattern on this transparent material. However, the material transparent to EUV light does not exist because of the wavelength region of the EUV light. In other words, in the lithography technique using the EUV light, the EUV light is absorbed by the material and cannot penetrate through it, and therefore, the mask which transmits the exposure light cannot be formed. Therefore, in the lithography technique using the EUV light, the optical system that reflects the exposure light from the mask is used instead of transmitting the exposure light through the mask.

More specifically, in the lithography technique using the EUV light, a multilayer film substrate utilizing the reflection (Bragg reflection) by a multilayer film made of a molybdenum (Mo) layer and a silicon (Si) layer is used as a mask substrate (mask blanks). The reflection by the multilayer film is the reflection utilizing a kind of interference. Also, in the mask for EUVL (EUVL mask), an absorber pattern, that is, a pattern of an absorbing film of EUV light and a buffer film is formed as a low-reflection region on a multilayer film reflection substrate in which a multilayer film made of a molybdenum layer, a silicon layer and others is deposited on a quartz glass substrate or a low thermal expansion glass substrate. More specifically, the EUVL mask has a structure in which an absorber pattern is formed on a multilayer film reflection substrate. When the EUV light is incident on the EUVL mask thus constituted, the EUV light incident on the absorber pattern is absorbed and not reflected, and on the other hand, the EUV light is incident on the multilayer film in the region in which the absorber pattern is not formed, and the EUV light is reflected from the multilayer film. By this means, the EUV light reflected from the EUVL mask is exposed onto the semiconductor substrate, and the circuit pattern formed on the EUVL mask can be transferred onto a resist film on a semiconductor substrate.

As described above, in the lithography technique using the EUV light, the EUV light is reflected by the mask. Therefore, when the EUV light is made incident in the normal line direction of a mask, the EUV light reflected by the mask is also delivered in the normal line direction of the mask. In this case, the EUV light incident on the mask and the light reflected by the mask are overlapped and interfere with each other. Accordingly, in the lithography technique using the EUV light, it is necessary to make the EUV light incident obliquely by an angle θ with respect to the normal line direction of the mask so that the EUV light incident on the mask and the EUV light reflected by the mask do not interfere with each other. In other words, in the EUVL in which the EUV light is reflected by a mask, it is inevitable to make the EUV light incident obliquely on the mask. The angle θ at this time is restricted by the numerical aperture (NA) and the reduction magnification of the imaging optical system which forms an image of the EUV light reflected from the mask on a semiconductor substrate, and the value of the angle θ is almost 5 to 6 degrees in many cases.

Here, in the EUVL mask, an absorber is formed for forming a pattern, and the case where the EUV light is obliquely incident on the absorber will be considered. For example, it is assumed that the absorber has a linear shape. While the thickness of the absorber is in a range of about 50 to 80 nm, the wavelength of the EUV light is about 10 nm. Therefore, for example, when the absorber with a linear shape extends in a first direction and the EUV light is incident obliquely on the EUVL mask from above in the second direction orthogonal to the first direction, the shadow is cast along the longitudinal direction (first direction) of the absorber extending linearly due to the thickness of the absorber. On the other hand, for example, when the absorber with a linear shape extends in the first direction and the EUV light is incident obliquely on the EUVL mask from above in the first direction, the shadow is hardly cast in the longitudinal direction (first direction) of the absorber extending linearly.

As a result, when the EUV light is incident obliquely on the linear absorbers orthogonal to each other in a specified direction, the direction in which the shadow is cast and the direction in which the shadow is hardly cast are present. Since the region where the shadow is cast is the region where the absorber is not present and the multilayer film is exposed, the region is originally the region where the amount of reflection light of the EUV light is large, but the amount of reflection light of the EUV light from this region is reduced because the shadow is cast. This means that the resolution in the transfer of the pattern formed on the EUVL mask onto a semiconductor substrate is decreased. Furthermore, if the direction in which the shadow is cast and the direction in which the shadow is hardly cast are present in the EUVL mask, the resolution differs in these directions and the dimensional accuracy of the pattern transferred onto the semiconductor substrate (resist film) differs depending on the directions. This means that the dimensional accuracy of the pattern transferred onto the semiconductor substrate (resist film) is decreased.

An object of the present invention is to provide a technique capable of improving the dimensional accuracy of a transferred pattern in the lithography technique in which EUV light is used and a pattern formed on a mask is transferred onto a semiconductor substrate (resist film) by forming an image of the EUV light reflected from the mask on the semiconductor substrate (resist film) after the EUV light is obliquely incident on the mask having the pattern formed thereon.

The above and other objects and novel characteristics of the present invention will be apparent from the description of this specification and the accompanying drawings.

The typical ones of the inventions disclosed in this application will be briefly described as follows.

A manufacturing method of a semiconductor device according to a representative embodiment comprises: (a) a step of forming a base film on a semiconductor substrate; (b) a step of forming a resist film on the base film; (c) a step of patterning the resist film; and (d) a step of patterning the base film by using the patterned resist film. At this time, the step (c) includes: (c1) a step of making extreme ultra violet light incident on an illumination optical system and making the extreme ultra violet light incident obliquely on a mask having a pattern formed thereon from the illumination optical system; and (c2) a step of making the extreme ultra violet light reflected obliquely from the mask incident on an imaging optical system and irradiating the extreme ultra violet light to the resist film formed on the semiconductor substrate from the imaging optical system. Here, the mask includes: a mask substrate having a first region and a second region; a multilayer film which is formed in the first region and the second region of the mask substrate and reflects the extreme ultra violet light; and an absorber which is formed on the multilayer film and absorbs the extreme ultra violet light. Further, the mask has a difference in level extending in a predetermined direction in a boundary between the multilayer film formed in the first region and the multilayer film formed in the second region. At this time, after the extreme ultra violet light is incident on and reflected from the mask on which the pattern formed of the difference in level and the absorber is formed, the extreme ultra violet light is irradiated on the resist film, thereby patterning the resist film so as to correspond to the pattern of the mask. At this time, out of a direction cosine component of a ray direction of the extreme ultra violet light incident obliquely on the mask, a direction of a projective component projected on a mask surface is set to intersect with an extending direction of the difference in level.

Further, another representative embodiment relates to a manufacturing method of a mask used in a process of making extreme ultra violet light incident obliquely on a mask having a pattern formed thereon and irradiating the extreme ultra violet light reflected by the mask onto a resist film formed on a semiconductor substrate, thereby patterning the resist film so as to correspond to the pattern of the mask. The manufacturing method of a mask comprises: (a) a step of preparing a mask substrate; (b) a step of forming a difference in level in a boundary between a first region of the mask substrate and a second region of the mask substrate; (c) a step of forming a multilayer film for reflecting the extreme ultra violet light on the mask substrate including the difference in level; and (d) a step of forming, on the multilayer film, an absorber pattern formed of absorbers which absorb the extreme ultra violet light.

The effects obtained by typical embodiments of the inventions disclosed in this application will be briefly described below.

It is possible to improve the dimensional accuracy of a transferred pattern in the lithography technique in which EUV light is used and a pattern formed on a mask is transferred onto a semiconductor substrate (resist film) by forming an image of the EUV light reflected from the mask on the semiconductor substrate (resist film) after the EUV light is obliquely incident on the mask having the pattern formed thereon.

BRIEF DESCRIPTIONS OF THE DRAWINGS

FIG. 27 is a diagram showing a part of a mask used for forming high-density hole patterns and an incident direction of an exposure light on a mask surface in the second embodiment, in which

FIG. 28 is a diagram showing the shape of the effective light source, in which

DESCRIPTIONS OF THE PREFERRED EMBODIMENTS

Figure 1:
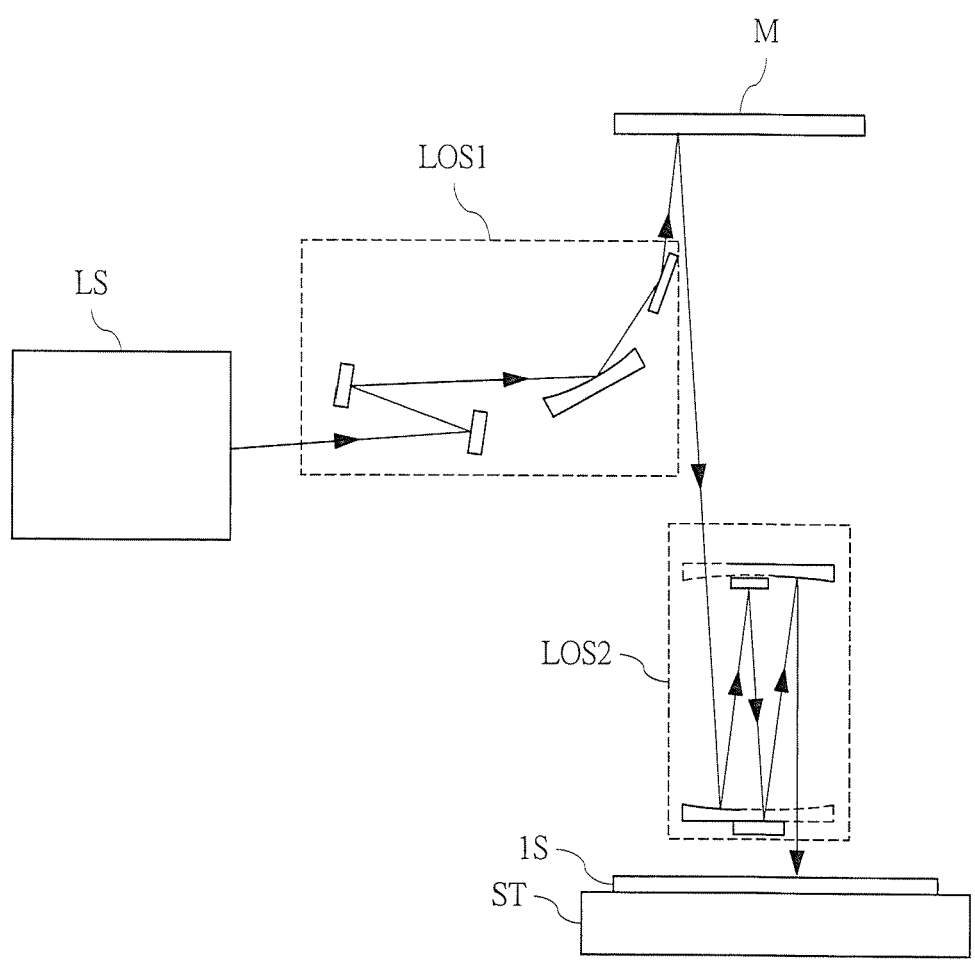
FIG. 1 is a configuration diagram of an exposure optical system using the EUV light.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Also, components having the same function are denoted by the same reference symbols throughout the drawings for describing the embodiments, and the repetitive description thereof is omitted. Note that hatching is used in some cases even in a plan view so as to make the drawings easy to see.

First Embodiment

For example, the ArF lithography technique using argon fluoride (ArF) excimer laser light with the wavelength of 193 nm has been developed, and the lithography technique using the EUV light (EUVL (Extreme Ultra Violet Lithography)) with the much shorter wavelength of 13.5 nm (12 to 15 nm) has been under development so as to meet the requirement for the further scaling down of a pattern. In other words, since the more miniaturized pattern can be transferred onto a semiconductor wafer as the wavelength of the exposure light is shortened, the wavelength of the exposure light has been shortened for the transfer of the further miniaturized pattern.

At this time, in the normal photolithography technique using the argon fluoride (ArF) excimer laser light with the wavelength of 193 nm, the exposure light is transmitted through the mask having the circuit pattern formed thereon, thereby transferring the pattern formed on the mask onto a semiconductor substrate. That is, the mask is made of a transparent material that transmits the exposure light, and a desired circuit pattern is formed on the mask by forming a light-shielding pattern on this transparent material. However, the material transparent to EUV light does not exist because of the wavelength region of the EUV light. In other words, in the lithography technique using the EUV light, the EUV light is absorbed by the material and cannot penetrate through it, and therefore, the mask which transmits the exposure light cannot be formed. Therefore, in the lithography technique using the EUV light, the optical system that reflects the exposure light from the mask is used instead of transmitting the exposure light through the mask.

FIG. 1 is a configuration diagram of an exposure optical system using the EUV light. As shown in FIG. 1, the exposure optical system using the EUV light includes a light source LS, an illumination optical system LOS1, a mask M, an imaging optical system LOS2 and a stage ST. The light source LS irradiates the EUV light (Extreme Ultra Violet) with the wavelength of 12 to 15 nm. The EUV light from the light source LS is incident on the illumination optical system LOS1, and the incident light is processed in the illumination optical system LOS1 and irradiated to the mask M. In general, the illumination optical system LOS1 is configured by using lens, but since the material transparent to EUV light does not exist, the illumination optical system LOS1 using the EUV light is configured of reflection mirrors (for example, concave mirror and convex mirror) that reflect the EUV light. More specifically, the illumination optical system LOS1 processes the shape of the EUV light by use of the reflection mirrors. A pattern (for example, circuit pattern) to be transferred onto a semiconductor substrate 1S is formed on the mask M, and the EUV light incident on the mask from the illumination optical system LOS1 is reflected in the reflection of the pattern formed on the mask M. The EUV light reflected by the mask M is incident on the imaging optical system LOS2, and the EUV light from the imaging optical system LOS2 forms an image on the semiconductor substrate 1S. In general, the imaging optical system LOS2 is configured by using lens, but since the material transparent to EUV light does not exist, the imaging optical system LOS2 using the EUV light is configured of reflection mirrors (for example, concave mirror and convex mirror) that reflect the EUV light. More specifically, the imaging optical system LOS2 condenses the EUV light by use of reflection mirrors and forms an image of the mask pattern on the semiconductor substrate 1S. The stage ST is used to place the semiconductor substrate 1S thereon and is configured so as to locate the semiconductor substrate 1S at the position where the image of the EUV light is formed by the imaging optical system LOS2. The EUV light is used in the exposure optical system shown in FIG. 1, and the exposure optical system including the light source LS, the illumination optical system LOS1, the mask M, the imaging optical system LOS2 and the stage ST is arranged in vacuum so as not to attenuate the EUV light.

The exposure optical system in the first embodiment is configured as described above, and the operation thereof will be described below with reference to FIG. 1. First, the EUV light is irradiated from the light source LS. The EUV light delivered from the light source LS is incident on the illumination optical system LOS1. The EUV light incident on the illumination optical system LOS1 is processed by being reflected by the reflection mirrors constituting the illumination optical system LOS1, and then delivered from the illumination optical system LOS1. Subsequently, the EUV light delivered from the illumination optical system LOS1 is incident on the mask M. The EUV light incident on the mask M is reflected in the reflection of the pattern formed on the mask M. Then, the EUV light reflected by the mask M is incident on the illumination optical system LOS2. The EUV light incident on the illumination optical system LOS2 is processed by the reflection mirrors constituting the imaging optical system LOS2, and an image of the pattern is formed on the semiconductor substrate 1S (in detail, resist film formed on the semiconductor substrate 1S) placed on the stage ST. In other words, the circuit pattern formed on the mask M is reduction-projected on the semiconductor substrate 1S by the imaging optical system LOS2. In this manner, the circuit pattern formed on the mask M can be transferred onto the resist film of the semiconductor substrate 1S.

As described above, a pattern is formed on the mask M, and the reflection light corresponding to the pattern can be delivered by making the EUV light incident on the pattern. The structure of the pattern formed on the mask M will be described below.

Figure 2:
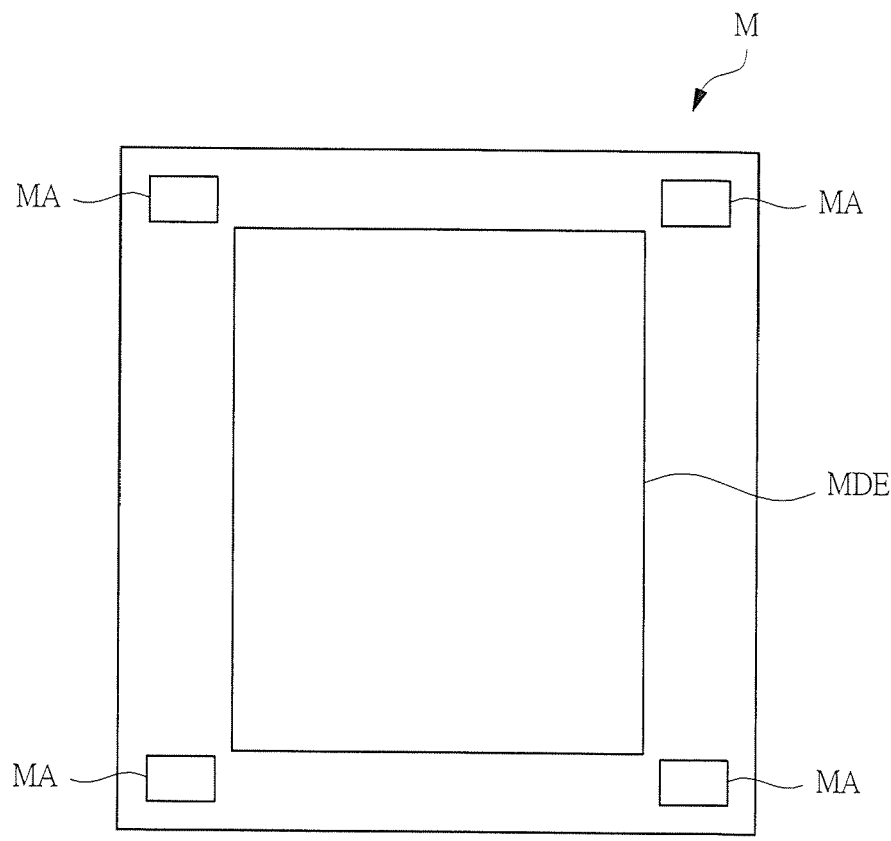
FIG. 2 is a diagram showing a planar structure of a mask.

FIG. 2 is a diagram showing a planar structure of the mask M. As shown in FIG. 2, the mask M has a rectangular shape, and alignment marks MA are formed at four corners of the rectangular mask M. This alignment mark MA is provided for the position alignment of the mask M. Further, a device pattern area MDE is formed in the central part of the mask M. The pattern of the circuit constituting the semiconductor device is formed in this device pattern area MDE. Therefore, the EUV light incident on and reflected by the mask M is irradiated onto this device pattern area MDE.

Figure 3:
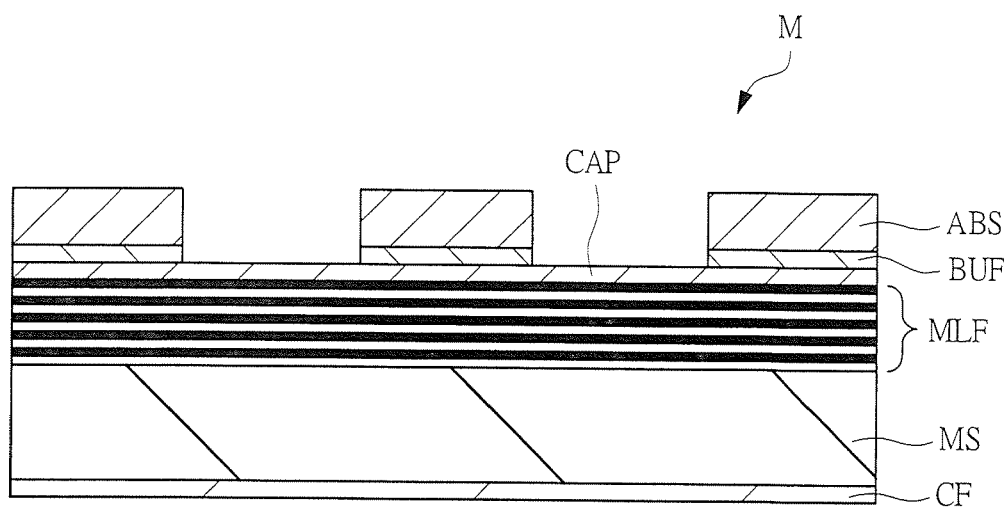
FIG. 3 is a cross-sectional view showing a cross section in a device pattern area of the mask shown in FIG. 2.

FIG. 3 is a cross-sectional view showing a cross section in the device pattern area MDE of the mask M shown in FIG. 2. As shown in FIG. 3, a multilayer film MLF is formed on a mask substrate MS in the mask M. The mask substrate MS is made of, for example, quartz glass or a low thermal expansion material, and the multilayer film MLF has a structure obtained by, for example, repeatedly stacking a silicon layer and a molybdenum layer. The multilayer film MLF is a film provided for reflecting the EUV light incident on the mask M. In other words, the multilayer film MLF formed of silicon layers and molybdenum layers reflects the EUV light by use of the multilayer film reflection caused by the difference in refractive index between the silicon layer and the molybdenum layer. This multilayer film reflection is the reflection utilizing a kind of interference. More specifically, the light reflected by the surface of the multilayer film MLF and the light reflected inside the multilayer film MLF interfere and are intensified by each other, so that the EUV light of a specified intensity or higher can be reflected.

A capping layer CAP is formed on the multilayer film MLF. This capping layer CAP is provided for protecting the multilayer film MLF and is made of, for example, a silicon layer and a ruthenium layer. Absorbers ABS are formed in a patterned shape on the capping layer CAP via a buffer layer BUF. The absorber ABS absorbs the EUV light incident on the mask M so as not to reflect the EUV light. This absorber ABS is made of, for example, a tantalum-based material such as tantalum nitride (TaN). The absorber ABS has a thickness of, for example, 50 to 100 nm from the standpoint of sufficiently absorbing the EUV light. The buffer layer BUF is a film functioning as a stopper to the etching performed when processing the absorber ABS, and it has a function to protect the multilayer film MLF formed below the buffer layer BUF from the etching damage. Note that a conductor film CF is formed on a rear surface of the mask substrate MS, and this conductor film CF is provided for electrostatically chucking the mask M to the stage.

In the mask constituted in the above-described manner, the region in which the multilayer film MLF is exposed and the region in which the absorber ABS is formed are provided, thereby patterning the EUV light. More specifically, when the EUV light is incident on the mask M, the EUV light is reflected and the reflection light is delivered in the region where the multilayer film MLF is exposed. Meanwhile, the EUV light is absorbed and no reflection light is generated in the region where the absorber ABS is formed. Accordingly, the circuit pattern is formed by the region in which the multilayer film MLF is exposed and the region in which the absorber ABS is formed, so that the reflection light in the reflection of the circuit pattern can be obtained.

In the lithography technique using the EUV light, the EUV light is reflected by the mask M. Therefore, when the EUV light is made incident in the normal line direction of the mask M, the EUV light reflected by the mask M is also delivered in the normal line direction of the mask M. In this case, the EUV light incident on the mask M and the EUV light reflected by the mask M are overlapped and interfere with each other. Accordingly, in the lithography technique using the EUV light, it is necessary to make the EUV light incident obliquely by an angle θ with respect to the normal line direction of the mask M so that the EUV light incident on the mask M and the EUV light reflected by the mask M do not interfere with each other. In other words, in the EUVL in which the EUV light is reflected by the mask M, it is inevitable to make the EUV light incident obliquely on the mask.

Figure 4:
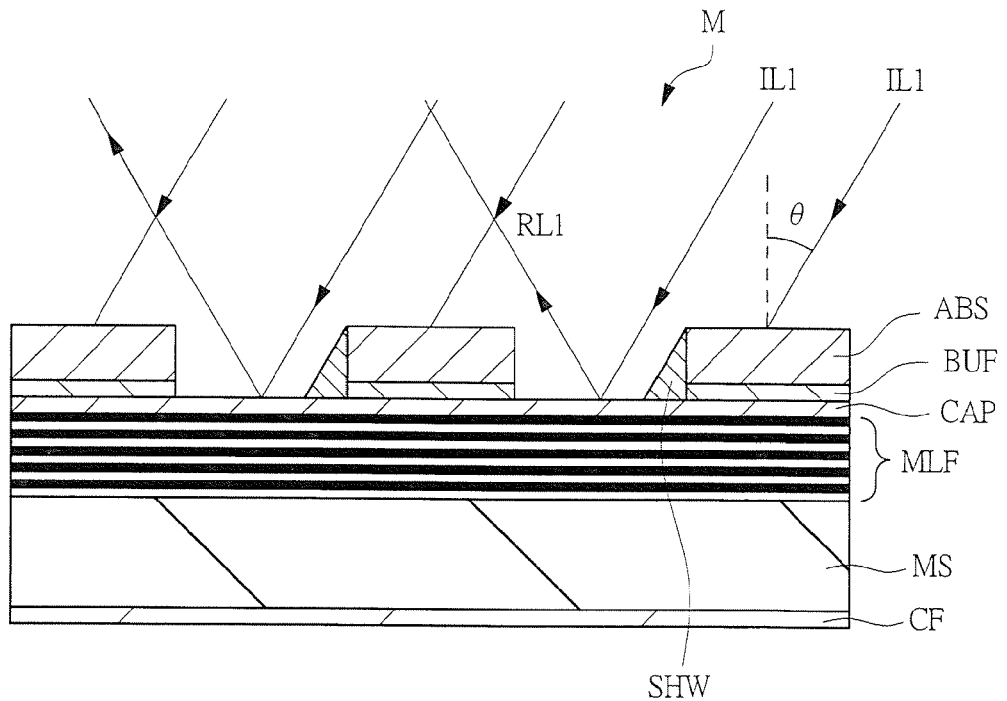
FIG. 4 is a diagram showing the case where absorbers in a linear shape are formed in the direction vertical to the paper surface, an incident light is incident in a specified direction and a reflection light is reflected.

As described above, in the mask M, the absorber ABS is formed for forming the pattern, and the case where the EUV light is obliquely incident on the absorber ABS will be considered. First, FIG. 4 is a diagram showing the case where the absorbers ABS in a linear shape are formed in the direction vertical to the paper surface, an incident light IL1 is incident on the mask M in the direction shown in FIG. 4 and a reflection light RL1 is reflected. As shown in FIG. 4, the EUV light irradiated to the absorber ABS out of the incident light IL1 is absorbed by the absorber ABS and no reflection light is generated. Meanwhile, the EUV light irradiated to the exposed multilayer film MLF out of the incident light IL1 is reflected by the multilayer film MLF and the reflection light RL1 is generated.

Now attention is focused on the interface between the region covered with the absorber ABS and the region where the multilayer film MLF is exposed. In this interface region, since the incident light IL1 is obliquely irradiated, a shadow region SHW as shown in FIG. 4 is formed. Since the shadow region SHW is the region not covered with the absorber ABS, it is desirable that the reflection light RL1 is generated from the shadow region SHW. However, when the incident light IL1 is incident obliquely, since the incident light IL1 is not irradiated to the shadow region SHW, the intensity of the reflection light RL1 reflected from the shadow region SHW is significantly reduced.

In particular, although the absorber ABS has a thickness of about 50 to 100 nm, the wavelength of the EUV light is about 10 nm. Therefore, for example, in the case where the linear absorbers extend in the direction vertical to the paper surface (first direction) and the EUV light is incident obliquely on the mask M from above in the second direction orthogonal to the first direction (case shown in FIG. 4), the shadow region SHW is remarkably formed along the longitudinal direction (first direction) of the absorbers ABS extending linearly by the thickness of the absorbers. Since the shadow region SHW is the region where the absorber ABS is not present and the multilayer film MLF is exposed, the region is originally the region where the amount of reflection of the EUV light is large, but the amount of reflection of the EUV light from this shadow region SHW is reduced because the shadow is cast. This means that the resolution in the transfer of the pattern formed on the mask M onto a semiconductor substrate is decreased.

More specifically, the region where the reflection light RL1 is generated forms a bright portion of the pattern and the region where the reflection light RL1 is absorbed forms a dark portion of the pattern. Therefore, the resolution is more improved as the contrast difference between the bright portion and the dark portion becomes larger. However, as described above, when the shadow region SHW where the amount of reflection of the reflection light RL1 is small is formed in the interface region between the bright portion of the pattern and the dark portion of the pattern, the contrast between the bright portion of the pattern and the dark portion of the pattern is decreased. This indicates that the resolution of the pattern is decreased.

Figure 5:
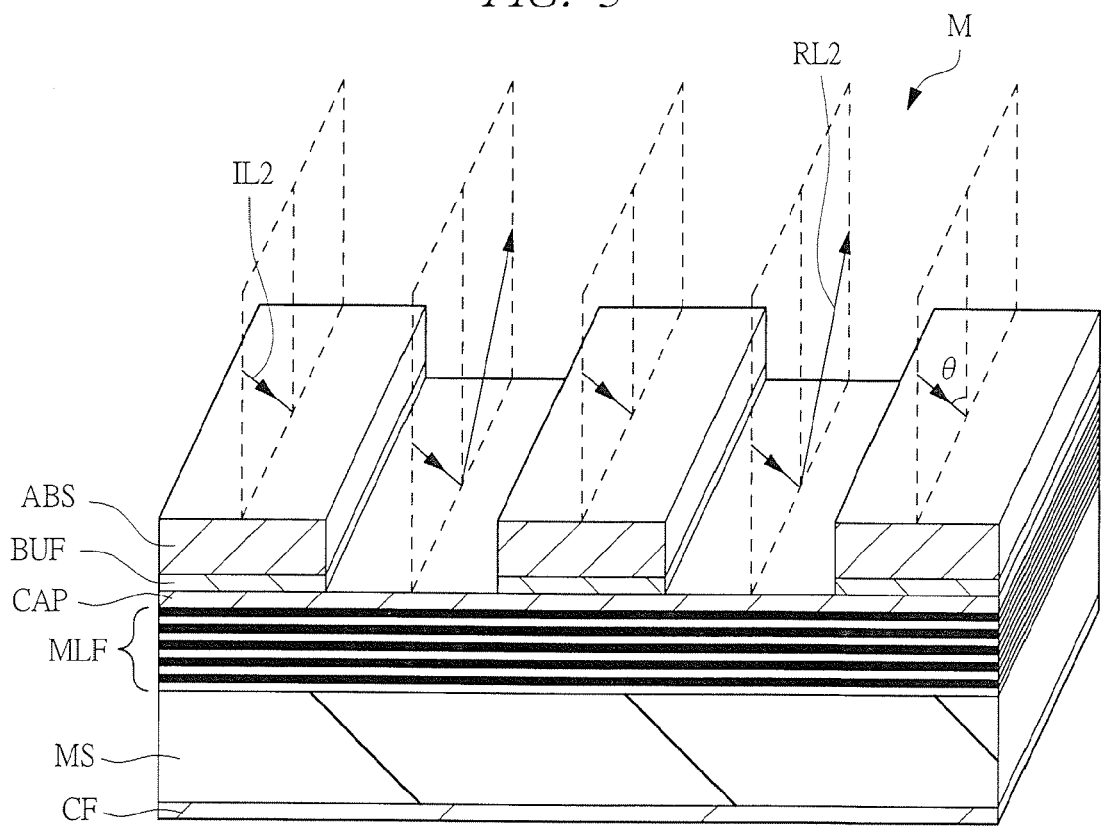
FIG. 5 is a diagram showing the case where the linear absorbers extend in the first direction and the EUV light is incident obliquely on the mask from above in the first direction.

On the other hand, FIG. 5 shows the case where the linear absorbers ABS extend in the first direction and the EUV light is incident obliquely on the mask M from above in the first direction. Also in the case shown in FIG. 5, the EUV light irradiated to the absorbers ABS out of the incident light IL2 is absorbed by the absorbers ABS and no reflection light is generated. Meanwhile, the EUV light irradiated to the exposed multilayer film MLF out of the incident light IL2 is reflected by the multilayer film MLF, and the reflection light RL2 is generated.

Now attention is focused on the interface between the region covered with the absorber ABS and the region where the multilayer film MLF is exposed. Although the difference in level is created in the interface regions as shown in FIG. 5, since the extending direction of the difference in level (first direction) and the traveling directions of the incident light IL2 and the reflection light RL2 (first direction) are parallel to each other, the shadow region is hardly formed in these regions. Therefore, the shadow region where the amount of reflection of the reflection light RL2 is small is not formed in the interface region (region with difference in level) between the bright portion of the pattern and the dark portion of the pattern, the contrast between the bright portion of the pattern and the dark portion of the pattern is not decreased in the structure of FIG. 5 compared with the structure of FIG. 4.

Accordingly, as shown in FIG. 4 and FIG. 5, it can be understood that the direction in which the shadow is cast and the direction in which the shadow is hardly cast are present depending on the direction of the incident light incident on the linear absorbers ABS. More specifically, in the case where the pattern made of linear absorbers orthogonal to each other is considered, when the EUV light is incident obliquely on the pattern made of absorbers orthogonal to each other in a specified direction, the direction in which the shadow is cast and the direction in which the shadow is hardly cast are present. If the direction in which the shadow is cast and the direction in which the shadow is hardly cast are present in the mask M as described above, the resolution differs in the respective directions, and the dimensional accuracy of the pattern transferred onto a semiconductor substrate (resist film) differs depending on the directions. This means that the dimensional accuracy of the pattern transferred onto the semiconductor substrate (resist film) is decreased.

Consequently, the first embodiment provides a technique capable of improving the dimensional accuracy of a pattern transferred onto a semiconductor substrate (resist film) in the lithography technique in which EUV light is used and an exposure optical system in which the EUV light is obliquely incident on the mask is used. For the achievement of this object, a mask is newly devised in the first embodiment. The lithography technique using this mask will be described below.

Figure 6:
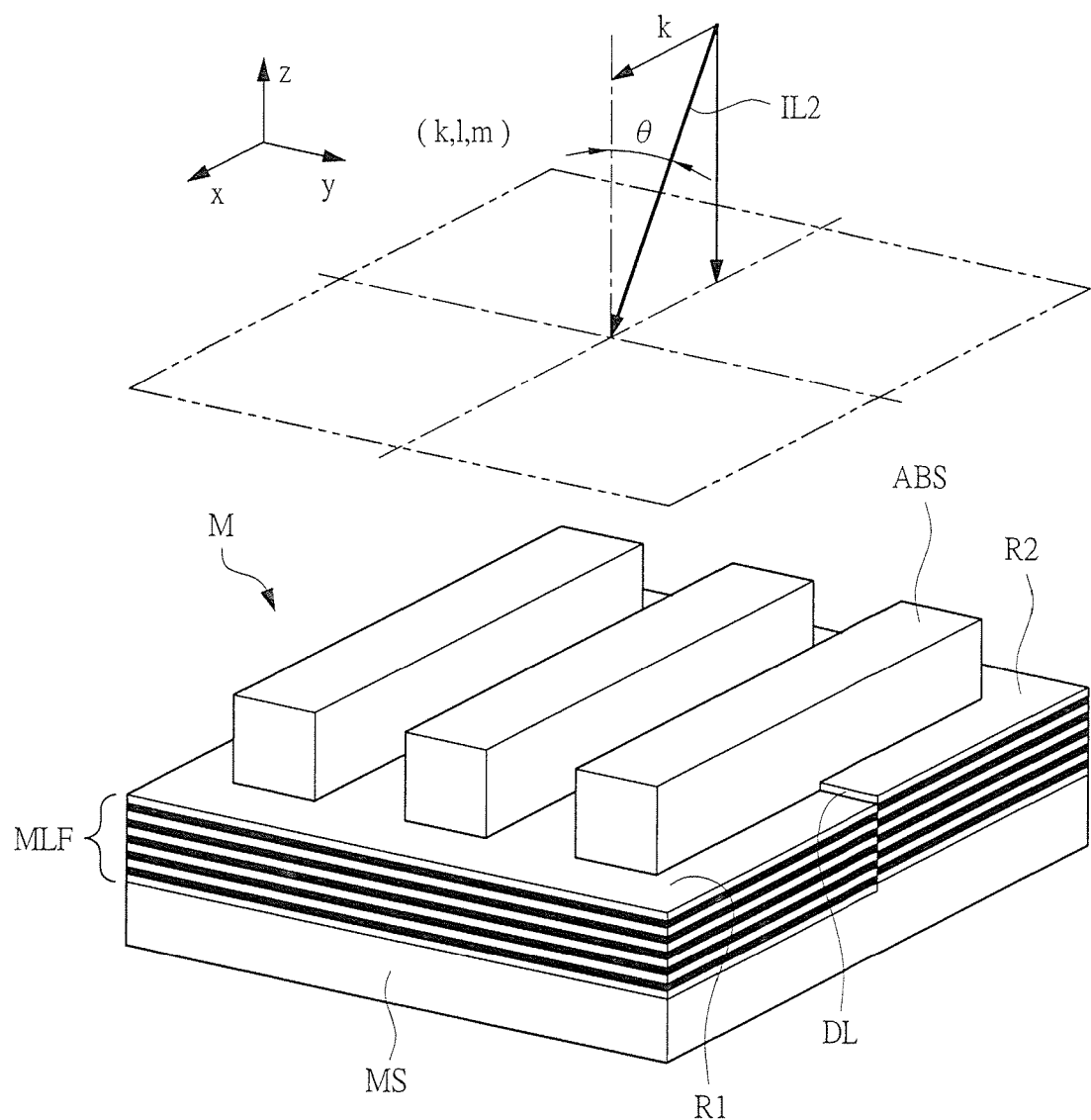
FIG. 6 is a diagram showing the structure of the mask in the first embodiment of the present invention.

FIG. 6 is a diagram showing the structure of the mask M in the first embodiment. In FIG. 6, in the mask M of the first embodiment, the multilayer film MLF is formed on the mask substrate MS. The mask substrate MS is made of, for example, quartz glass or a low thermal expansion material, and the multilayer film MLF has a structure obtained by, for example, repeatedly stacking a silicon layer and a molybdenum layer. The multilayer film MLF is a film provided for reflecting the EUV light incident on the mask M. More specifically, the multilayer film MLF formed of, for example, silicon layers and molybdenum layers reflects the EUV light by use of the multilayer film reflection caused by the difference in refractive index between the silicon layer and the molybdenum layer. This multilayer film reflection is the reflection utilizing a kind of interference. More specifically, the light reflected by the surface of the multilayer film MLF and the light reflected inside the multilayer film MLF interfere and are intensified by each other, so that the EUV light of a specified intensity or higher can be reflected.

In the mask M in the first embodiment, a difference in level DL is formed on the mask substrate MS. In other words, the difference in level DL is formed between a first region R1 and a second region R2 of the mask substrate MS. The first region R1 of the mask substrate MS is formed to be lower in level than the second region R2 of the mask substrate MS, thereby forming the difference in level DL at the interface between the first region R1 and the second region R2. This difference in level DL is formed so as to extend in the y direction of FIG. 6.

The multilayer film MLF is formed on the mask substrate MS having the difference in level DL. This multilayer film MLF has a uniform thickness in the first region R1 and the second region R2. Therefore, the difference in level DL formed on the mask substrate MS appears at the interface between the first region R1 and the second region R2 even when the multilayer film MLF is formed on the mask substrate MS.

Subsequently, the absorbers ABS are formed in a patterned shape on the multilayer film MLF having the difference in level DL formed thereon. The absorber ABS absorbs the EUV light incident on the mask M so as not to reflect the EUV light. This absorber ABS is made of, for example, a tantalum-based material such as tantalum nitride (TaN). The absorber ABS has a thickness of, for example, 50 to 100 nm from the standpoint of sufficiently absorbing the EUV light.

The mask M in the first embodiment includes a plurality of absorbers ABS, and each of the absorbers ABS has a linear shape and is formed to extend in an x axis direction. More specifically, in the first embodiment, the difference in level DL and the absorbers ABS are formed to be orthogonal to each other. Specifically, the absorbers ABS extend in the x axis direction and the difference in level DL extends in the y axis direction.

Though not shown in FIG. 6, the capping layer CAP, the buffer layer BUF and the conductor film CF similar to those shown in FIG. 3 are formed also in the mask M of the first embodiment.

Figure 7:
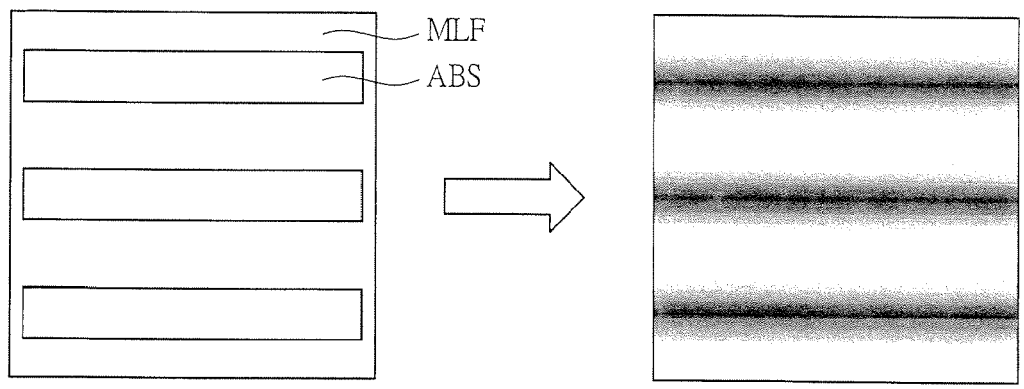
FIG. 7 is a diagram showing the pattern formed by the absorption by the absorbers and the reflection by the multi-layer film.

By the mask M configured as described above, an arbitrary circuit pattern can be formed. This will be described below. When the incident light IL2 is irradiated to the mask M shown in FIG. 6, the EUV light is absorbed in the region where the absorber ABS is formed and the EUV light is reflected in the region where the absorber ABS is not formed and the multilayer film MLF is exposed. As a result, the bright portion by the reflection of the multilayer film MLF and the dark portion by the absorption of the absorber ABS are formed. FIG. 7 is a diagram showing the pattern formed by the absorption by the absorbers ABS and the reflection by the multilayer film MLF. As shown in FIG. 7, it can be understood that the pattern including bright portions and dark portions (right side of FIG. 7) is formed in accordance with the pattern of the absorbers ABS and the multilayer film MLF (left side of FIG. 7). In other words, by laterally arranging the absorbers ABS (line pattern) as shown on the left side of FIG. 7, the dark portions in the shape of lateral stripes as shown on the right side of FIG. 7 can be formed.

Figure 8:
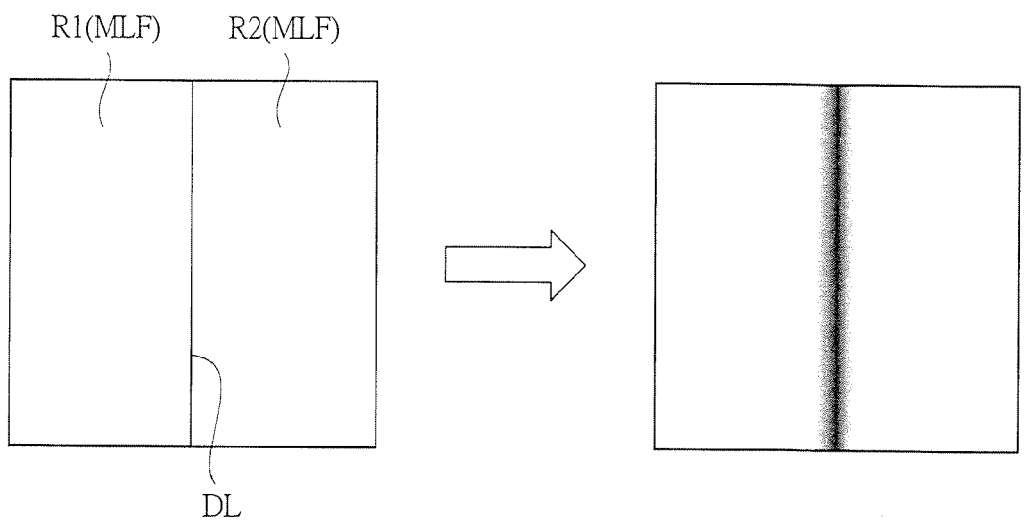
FIG. 8 is a diagram showing the pattern by the difference in level.

On the other hand, by the difference in level DL shown in FIG. 6, the dark portion is formed along the extending direction of the difference in level DL. This will be described below. FIG. 8 is a diagram showing the pattern by the difference in level DL. As shown on the left side of FIG. 8, the difference in level DL is formed along the boundary between the first region R1 and the second region R2 each having different heights, and the pattern including bright portions and dark portions is formed in accordance with the difference in level DL as shown on the right side of FIG. 8. In other words, it can be understood that the dark portion (dark line) shown on the right side of FIG. 8 is formed along the extending direction of the difference in level DL shown on the left side of FIG. 8. The formation of the dark portion along the difference in level DL is based on the following mechanism.

It is assumed that the incident light IL2 is incident on the first region R1 and the second region R2 shown on the left side of FIG. 8. Then, since the multilayer film MLF is exposed in both the first region R1 and the second region R2, the incident light IL2 is reflected. Therefore, the EUV light is reflected from the whole surface of the first region R1 and the second region R2 when the difference in level DL is not formed between the first region R1 and the second region R2, and the dark portion is not formed and the pattern including the bright portion in the entire region is probably formed.

However, the height of the first region R1 is different from that of the second region R2 in reality, and the difference in level DL is formed along the boundary between the first region R1 and the second region R2. By the presence of the difference in level DL, the optical path difference occurs between the EUV light reflected by the first region R1 and the EUV light reflected by the second region R2. When this optical path difference reaches a half of the wavelength, the EUV light reflected by the first region R1 and the EUV light reflected by the second region R2 interfere and are weakened by each other. More specifically, in the boundary region between the first region R1 and the second region R2, the EUV light reflected by the first region R1 and the EUV light reflected by the second region R2 are overlapped and interfere with each other. At this time, when the optical path difference reaches a half of the wavelength, the phase difference between the EUV light reflected by the first region R1 and the EUV light reflected by the second region R2 becomes 180 degrees, and these EUV lights are weakened by each other. As a result, the EUV lights are weakened by each other at the boundary between the first region R1 and the second region R2, so that the light intensity of the reflection light is decreased and the dark portion is formed. According to the mechanism described above, the dark portion is formed along the difference in level DL formed along the boundary between the first region R1 and the second region R2 having different heights.

For the formation of the dark portion by the interference, the phase difference between the EUV light reflected by the first region R1 and the EUV light reflected by the second region R2 has to be 180 degrees. In other words, the optical path difference has to be $\frac{1}{2}\lambda$. Since this phase difference is defined by the height of the difference in level DL, the height of the difference in level DL is desirably set to $\lambda$ (wavelength of EUV light)$\times \frac{1}{4}$. By this means, since the optical path difference occurs by the back and forth paths of the light (twice the height of the difference in level DL), the phase difference between the EUV light reflected by the first region R1 and the EUV light reflected by the second region R2 can be set to 180 degrees. Accordingly, it can be understood that the height of the difference in level DL is desirably set to about 3 to 4 nm in consideration of the fact that the wavelength of the EUV light is 12 to 15 nm. As above, the dark portion caused by the difference in level DL can be described by the phase shift effect by the difference in level DL.

As shown in FIG. 7 and FIG. 8, the dark portions of lateral stripes can be formed by the absorbers ABS of line patterns, and further, the longitudinal dark portion can be formed by providing the difference in level DL so as to be orthogonal to the absorber ABS. Therefore, by providing the linear absorbers ABS and the difference in level DL orthogonal to the absorber ABS, the longitudinal and lateral dark portions can be freely formed. This means that arbitrary dark portions can be formed by the dark portion in the longitudinal direction and the dark portion in the lateral direction by using the mask M shown in FIG. 6, and it can be understood that the arbitrary circuit pattern can be formed by the mask M shown in FIG. 6.

Next, the first embodiment is characterized in that the difference in level DL is provided on the multilayer film MLF in the mask M and the incident light IL2 (EUV light) is incident on the mask M in a specified direction. This characteristic of the first embodiment will be described. First, the incident light IL2 is incident on the mask M having the structure shown in FIG. 6. At this time, the direction of the projective component projected on the mask surface out of the direction cosine component of the ray direction of the EUV light (incident light IL2) incident obliquely on the mask M intersects with the extending direction of the difference in level DL. More specifically, when the ray direction of the incident light IL2 is dissolved into an x component, a y component and a z component, the x component of the incident light IL2 is k, the y component of the incident light IL2 is l and the z component of the incident light IL2 is m in FIG. 6. That is, the ray direction of the incident light IL2 can be expressed by (k, l, m). At this time, the direction cosine component of the ray direction of the incident light IL2 is k, l and m, and the projective component projected on the mask surface out of this direction cosine component is k and l. Since l=0 in the case of FIG. 6, the ray direction of the incident light IL2 is (k, 0, m). Therefore, the direction cosine component of the ray direction of the incident light IL2 is k. Here, the ray direction of the incident light IL2 (k, 0, m) can be expressed as $(\sin\theta, 0, -\cos\theta)$ when the angle between the ray direction and the z axis in FIG. 6 is $\theta$.

The projective component of the incident light IL2 as described above is $k=\sin\theta$, and it is the direction parallel to the x axis direction. Therefore, since the difference in level DL formed on the mask M extends in the y axis direction as shown in FIG. 6, the direction of the projective component of the incident light IL2 and the extending direction of the difference in level DL are orthogonal to each other. Therefore, when the incident light IL2 is incident in the direction shown in FIG. 6, the shadow region is probably formed by the difference in level DL. However, the height of the difference in level DL is almost $\lambda \times \frac{1}{4}$ ($\lambda$ is wavelength of EUV light) as described above and $\lambda$ is about 12 to 15 nm. Therefore, the height of the difference in level DL is at most about 3 to 4 nm. At this time, for example, the height of the difference in level DL is much smaller than the wavelength $\lambda$ (12 nm to 15 nm) of the EUV light, and therefore, the influence of the shadow region formed by the difference in level DL is almost negligible.

For example, when the line pattern extending in the y direction is formed by using the absorber ABS instead of forming the dark portion by the difference in level DL, since the height of the absorber ABS is 50 to 100 nm, the influence of the shadow region formed by the absorber ABS is increased. Therefore, like in the mask M in the first embodiment shown in FIG. 6, the difference in level DL extending in the y direction is formed and the projective component (k) projected on the mask surface out of the direction cosine component of the incident light IL2 is set so as to be orthogonal to the extending direction of the difference in level DL. By this means, even when the incident light IL2 is incident obliquely on the mask M, the influence of the shadow region can be sufficiently reduced.

Meanwhile, since the absorber ABS extends in the x axis direction as shown in FIG. 6, the extending direction (x direction) of the absorber ABS and the projective component (k) projected on the mask surface out of the direction cosine component of the incident light IL2 are parallel to each other. Therefore, the shadow region by the absorber ABS is hardly formed.

As described above, the first embodiment can exert a significant effect, that is, it is possible to improve the dimensional accuracy of a pattern transferred onto a semiconductor substrate (resist film) in the lithography technique in which EUV light is used and an exposure optical system in which the EUV light is obliquely incident on the mask is used.

The first embodiment is characterized in that, in the mask M shown in FIG. 6, the difference in level DL extending in the y direction is formed and the projective component (k) projected on the mask surface out of the direction cosine component of the incident light IL2 is set so as to be orthogonal to the extending direction of the difference in level DL. When expressed in another way, in the mask M shown in FIG. 6, the absorber ABS extending in the x direction is formed and the projective component (k) projected on the mask surface out of the direction cosine component of the incident light IL2 is set so as to be parallel to the extending direction of the absorber ABS.

As described above, in the first embodiment, the ray direction of the incident light IL2 is defined as (k, 0, m), but this setting condition is not always satisfied in the entire mask M. That is, the ray direction of the incident light IL2 is deviated from (k, 0, m) depending on the region of the mask M. This will be described below.

Figure 9:
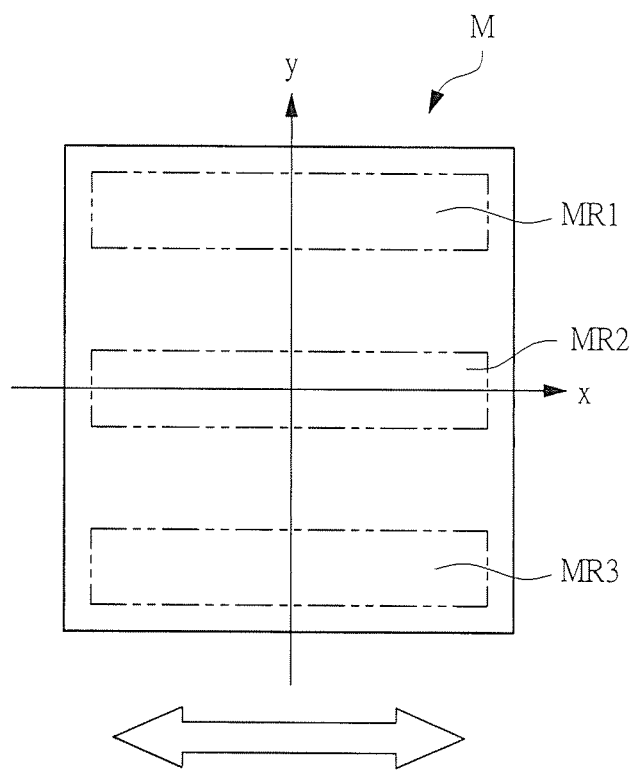
FIG. 9 is a diagram showing the plane of the mask.

FIG. 9 is a diagram showing the mask M. As shown in FIG. 9, the real mask M is scanned in the direction indicated by the arrow along the x axis direction, and the pattern formed on the whole surface of the mask M is transferred onto the semiconductor substrate. More specifically, the pattern formed on the whole surface of the mask M is not exposed at once, but is exposed while scanning the partial region of the mask M. At this time, since the reflection projection exposure apparatus is used, the values of the ray direction of the incident light IL2 (k, l, m) differ in the regions having different y coordinate values in the mask M. For example, in FIG. 9, the values of the ray direction of the incident light IL2 (k, l, m) differ in the regions MR1, the region MR2 and the region MR3 having different y coordinate values.

Figure 10:
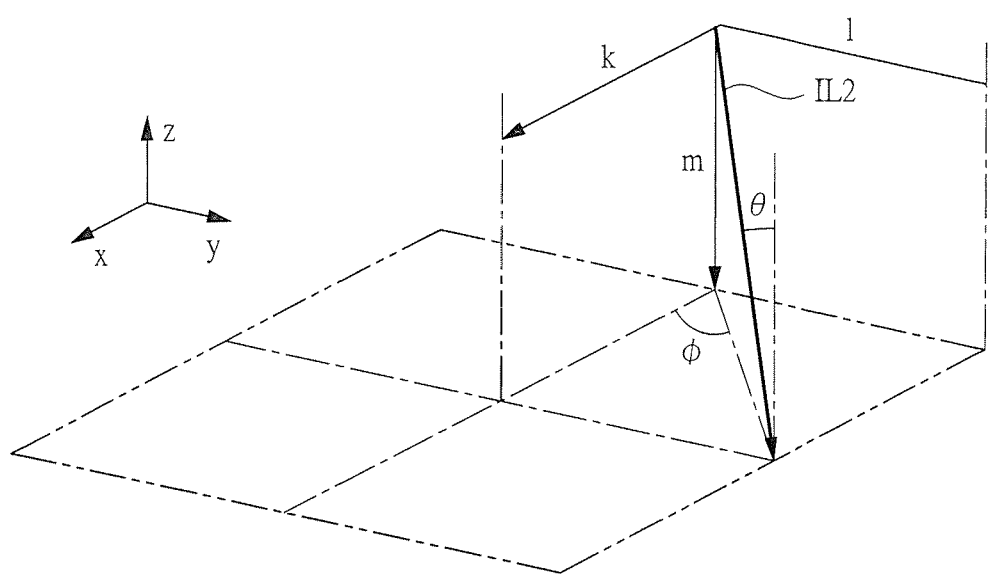
FIG. 10 is a diagram showing the direction of the incident light incident on the mask.

In the region MR2 including "y=0", the ray direction of the incident light IL2 (k, l, m) is (sin θ, 0, −cos θ) as described above. However, in the region MR1 and the region MR3 formed in the peripheral region of the mask M and having large y coordinate values, the ray direction (k, l, m) differs from the ray direction (sin θ, 0, −cos θ) of the region MR2 as shown in FIG. 10. FIG. 10 is a diagram showing the ray direction of the incident light IL2 incident on the region MR3 shown in FIG. 9. As shown in FIG. 10, the ray direction of the incident light IL2 in the region MR3 can be expressed as (k, l, m)=(sin θ cos φ, sin θ sin φ, −cos θ) by using the angle φ defined when the field of the exposure apparatus is determined. Similarly, the ray direction of the incident light IL2 in the region MR1 can be expressed as (k, l, m)=(sin θ cos φ, −sin θ sin φ, −cos θ). Therefore, in the region MR1 and the region MR3, the projective component projected on the mask surface out of the direction cosine component k, l, m of the incident light IL2 is k and l. Therefore, the projection direction is directed to the direction expressed by (x, y)=(k, l). More specifically, in the region MR2, the projection direction of the incident light IL2 is (x, y)=(k, 0) and is the direction parallel to the x axis direction, but in the region MR1 and the region MR3, the projection direction of the incident light IL2 is (x, y)=(k, l) and is not the direction parallel to the x axis direction. In other words, in the region MR1 and the region MR3, the projection direction of the incident light IL2 is directed to the direction intersecting with the x axis direction. Accordingly, when the incident light IL2 is incident on the region MR1 and the region MR3 of the mask M having the structure shown in FIG. 6, the projection direction of the incident light IL2 (k, l) is not parallel to the absorber ABS extending in the x axis direction, and as a result, the shadow region is probably formed along the longitudinal side surface of the absorber ABS.

However, since the angle φ is very small in reality though it is drawn as if it is large so as to make the description easier in FIG. 10, it can be considered that sin φ≈φ≈0. In other words, it can be considered that the projection direction of the incident light IL2 in the region MR1 and the region MR3 is (x, y)=(k, l (≈0)). Therefore, since it can be considered that the projection direction of the incident light IL2 (k, l (≈0)) is almost parallel to the absorber ABS extending in the x axis direction even in the region MR1 and the region MR3, the shadow region formed along the longitudinal side surface of the absorber ABS is almost negligible.

As described above, in the mask M shown in FIG. 6, the absorber ABS extending in the x direction and the difference in level DL extending in the y direction are formed, and further, the projective component (k) projected on the mask surface out of the direction cosine component of the incident light IL2 is set to be almost orthogonal to the extending direction of the difference in level DL. By this means, the formation of the shadow region caused by the absorber ABS can be suppressed in the whole region of the mask M. More specifically, the technical idea of the first embodiment is characterized in that the dark portion extending in the direction intersecting with the projection direction of the incident light IL2 is formed by the difference in level DL instead of the absorber ABS. Since the absorber ABS with large height can be replaced with the difference in level DL whose height is almost negligible, the formation of the shadow region can be suppressed. As a result, in the lithography technique in which the EUV light is used and the exposure optical system in which the EUV light is obliquely incident on the mask is used, the dimensional accuracy of the pattern transferred onto the semiconductor substrate (resist film) can be improved.

Figure 11:
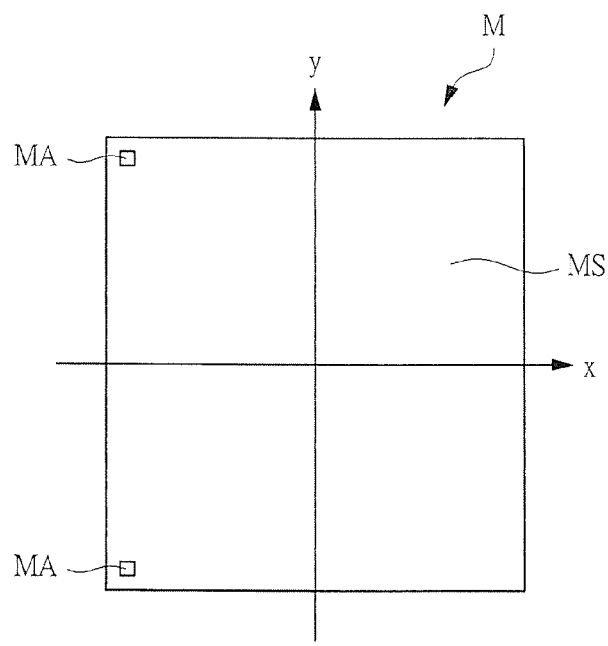
FIG. 11 is a diagram showing the planar structure of the mask in the first embodiment.

In the first embodiment, a specified pattern is transferred onto a semiconductor substrate (resist film) by using the mask M shown in FIG. 6. More specifically, the first transfer pattern by the absorber ABS formed on the surface of the multilayer film MLF and the second transfer pattern by the difference in level DL formed in the boundary region between the first region R1 and the second region R2 on which the multilayer film MLF is formed are combined to transfer the desired circuit pattern onto the semiconductor substrate (resist film). Accordingly, in the mask M, when the absorber ABS that absorbs the EUV light is to be formed on the multilayer film MLF, the absorber ABS has to be aligned with the difference in level DL formed on the mask substrate MS so as to maintain a predetermined positional relation. More specifically, the alignment of the absorber ABS to be formed on the multilayer film MLF is indispensable. Thus, in the first embodiment, the alignment marks MA are formed in the predetermined regions of the mask M. FIG. 11 is a diagram showing the planar structure of the mask in the first embodiment. As shown in FIG. 11, in the mask M, the alignment marks MA are formed at corner portions of the rectangular mask substrate MS.

Figure 12:
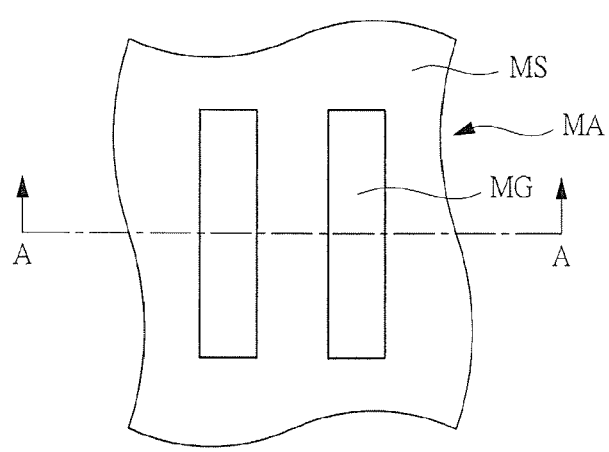
FIG. 12 is a diagram showing the alignment mark in an enlarged manner.
Figure 13:
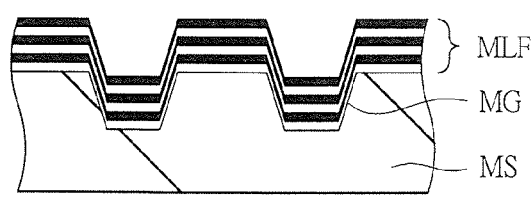
FIG. 13 is a cross-sectional view taken along the line A-A of FIG. 12.

This alignment mark MA can be formed simultaneously with, for example, forming the difference in level DL on the mask substrate MS. FIG. 12 is a diagram showing the alignment mark MA in an enlarged manner. As shown in FIG. 12, the alignment mark MA is composed of grooves MG formed on the mask substrate MS. FIG. 13 is a cross-sectional view taken along the line A-A of FIG. 12. As shown in FIG. 13, it can be understood that the grooves MG are formed on the mask substrate MS and the multilayer film MLF is formed on the mask substrate MS including the grooves MG. By forming the alignment marks MA from the grooves MG in this manner, the alignment mark MA can be recognized as a pattern by the phase shift effect between the EUV light incident on the groove MG and the EUV light incident on the position other than the groove MG.

However, when the groove MG to be the alignment mark MA is formed in the same process as the difference in level DL, since the height of the difference in level DL is 3 to 4 nm, the depth of the groove MG is also about 3 to 4 nm. Accordingly, in the structure where the groove MG is simply engraved in the mask substrate MS and then the multilayer film MLF is formed on the grave MG, it is difficult to observe the alignment mark MA in some cases. For its solution, another method for forming the easily observable alignment marks will be described below.

First, in the initial stage of manufacturing the mask M, a concave portion with a minute width is formed in advance on the flat mask substrate MS by a method such as the FIB (Focused Ion Beam). This concave portion has a sufficient depth compared with the groove MG described above. Then, by depositing the multilayer film MLF so as to cover the formed concave portion, the alignment mark MA formed by the concave portion can be formed. Since this alignment mark MA is formed by the sufficiently deep concave portion, when the alignment mark MA is observed by the light, the electron beam or the EUV light, it is recognized as a pattern with a large phase change. In this manner, the alignment mark MA excellent in visibility can be formed.

Note that, in the first embodiment, two alignment marks MA are formed at the corner portions of the rectangular mask substrate MS as shown in FIG. 11. Though not particularly limited, the planar dimension of the alignment mark MA is, for example, about 200 to 2000 nm.

The mask M of the first embodiment has the structure as described above, and the manufacturing method of the mask M will be described below with reference to the drawings.

Figure 14:
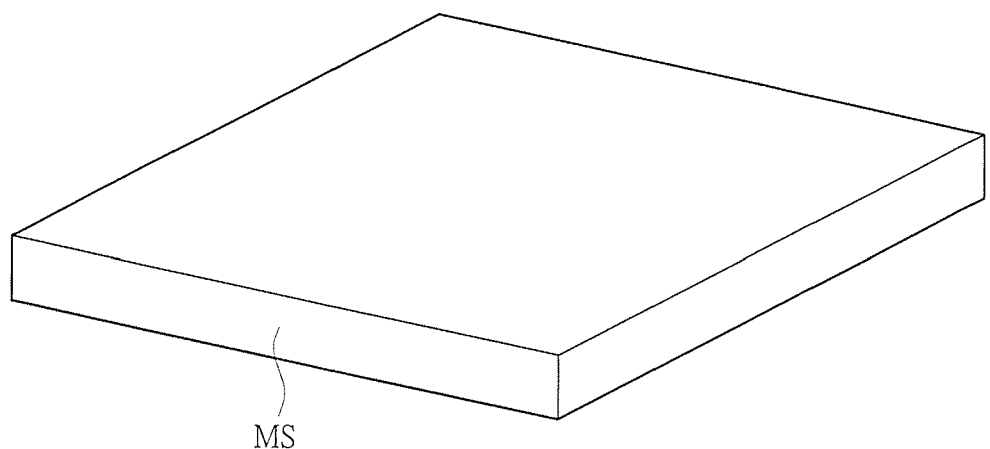
FIG. 14 is a perspective view showing the manufacturing process of the mask according to the first embodiment.
Figure 15:
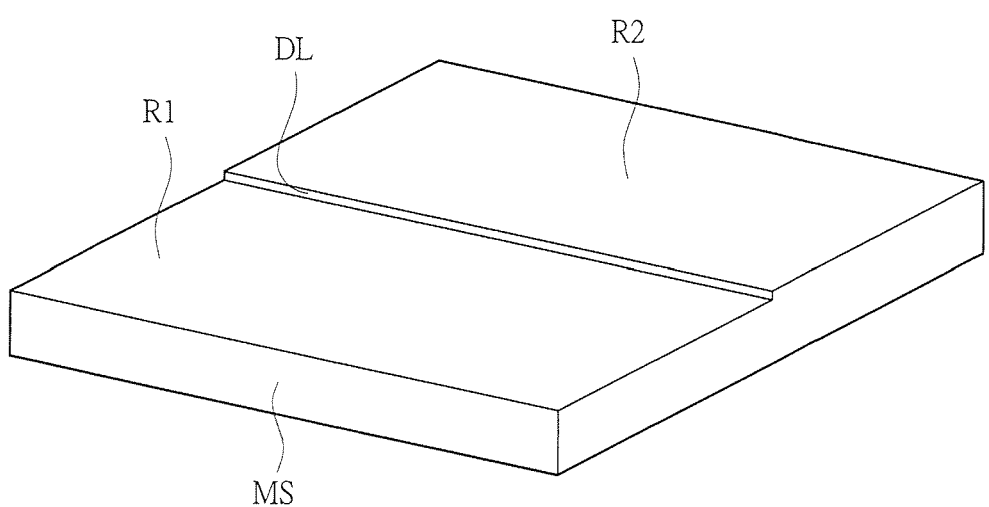
FIG. 15 is a perspective view showing the manufacturing process of the mask continued from FIG. 14.

First, as shown in FIG. 14, the mask substrate MS made of quartz glass or a low thermal expansion material is prepared. This mask substrate MS has a rectangular shape, and the surface thereof is planarized. Subsequently, as shown in FIG. 15, the difference in level DL is formed on the surface of the mask substrate MS. The first region R1 with a smaller height and the second region R2 with a larger height are formed on the surface of the mask substrate MS, thereby forming the difference in level DL in the boundary region between the first region R1 and the second region R2. The height of the difference in level DL is desirably set to about one quarter of the wavelength of the EUV light illuminated to the mask for exposure, and for example, it is set to 3.4 nm in the first embodiment.

Figure 16:
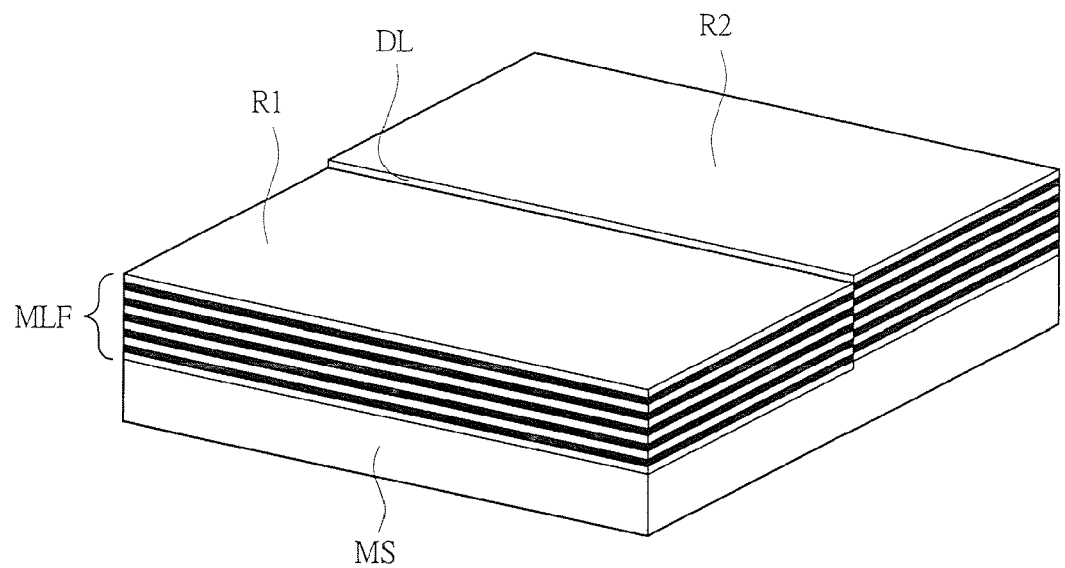
FIG. 16 is a perspective view showing the manufacturing process of the mask continued from FIG. 15.

Thereafter, as shown in FIG. 16, the multilayer film MLF is formed on the mask substrate MS on which the difference in level DL has been formed. The multilayer film MLF is formed by, for example, alternately depositing a silicon layer and a molybdenum layer by using the deposition method. In the first embodiment, a stacked film composed of one silicon layer and one molybdenum layer is taken as a unit, and about 40 units of this stacked film are formed. At this time, the multilayer film MLF is formed so as to have a uniform thickness on the whole surface of the mask substrate MS having the difference in level DL, and the thickness of the multilayer film MLF is, for example, 280 nm. Therefore, the thickness of the multilayer film MLF formed on the first region R1 of the mask substrate MS and the thickness of the multilayer film MLF formed on the second region R2 of the mask substrate MS are almost equal to each other, and even when the multilayer film MLF is formed on the mask substrate MS, the level difference by the difference in level DL formed in the boundary region between the first region R1 and the second region R2 is maintained. As described above, in the first embodiment, the phase difference of about 180 degrees can be given between the reflection light from the first region R1 and the reflection light from the second region R2 without changing the material and the cycle length of the multilayer film MLF for each region.

Figure 17:
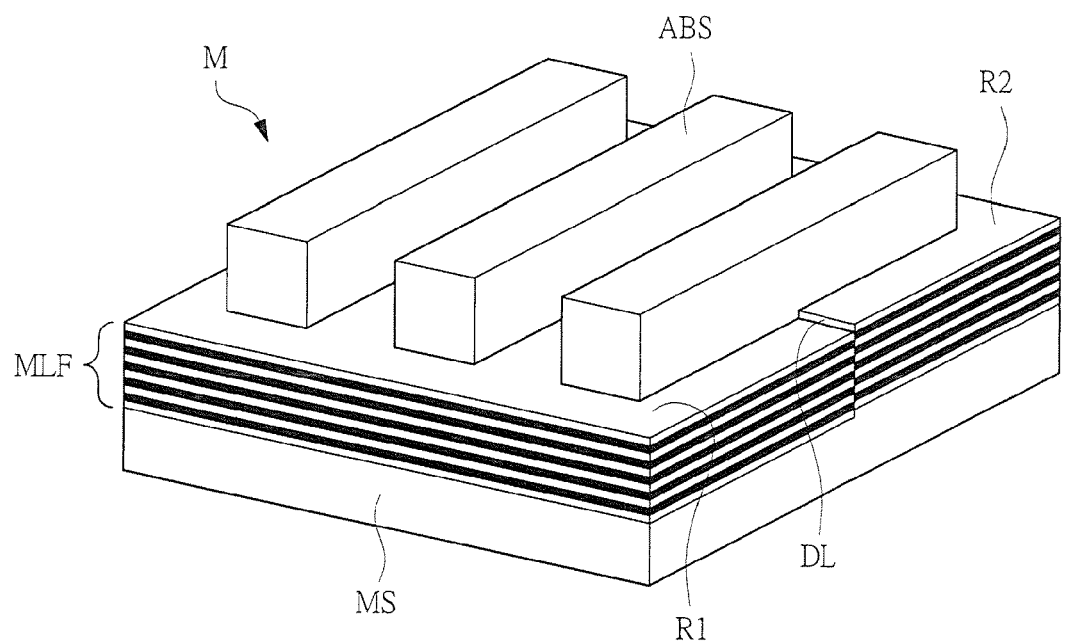
FIG. 17 is a perspective view showing the manufacturing process of the mask continued from FIG. 16.

Next, though not shown, after a capping layer for protecting the multilayer film MLF is formed on the multilayer film MLF, a buffer layer is formed on this capping layer. Then, as shown in FIG. 17, the absorber ABS is formed on the buffer layer. The absorber ABS is made of a tantalum-based material such as tantalum nitride (TaN). Thereafter, by using the photolithography technique and the etching technique, the absorber ABS is patterned. In the patterning of the absorber ABS, the absorber ABS is processed into a line pattern, and the line pattern of the absorber ABS is formed so as to intersect with the extending direction of the difference in level DL. In the etching for the patterning of the absorber ABS, the buffer layer formed below the absorber ABS assumes a role of an etching stopper. Therefore, in the patterning of the absorber ABS, the etching damage given to the multilayer film MLF can be reduced. Further, after patterning the absorber ABS, the exposed buffer layer is removed. In this manner, the mask of the first embodiment can be manufactured.

Figure 18:
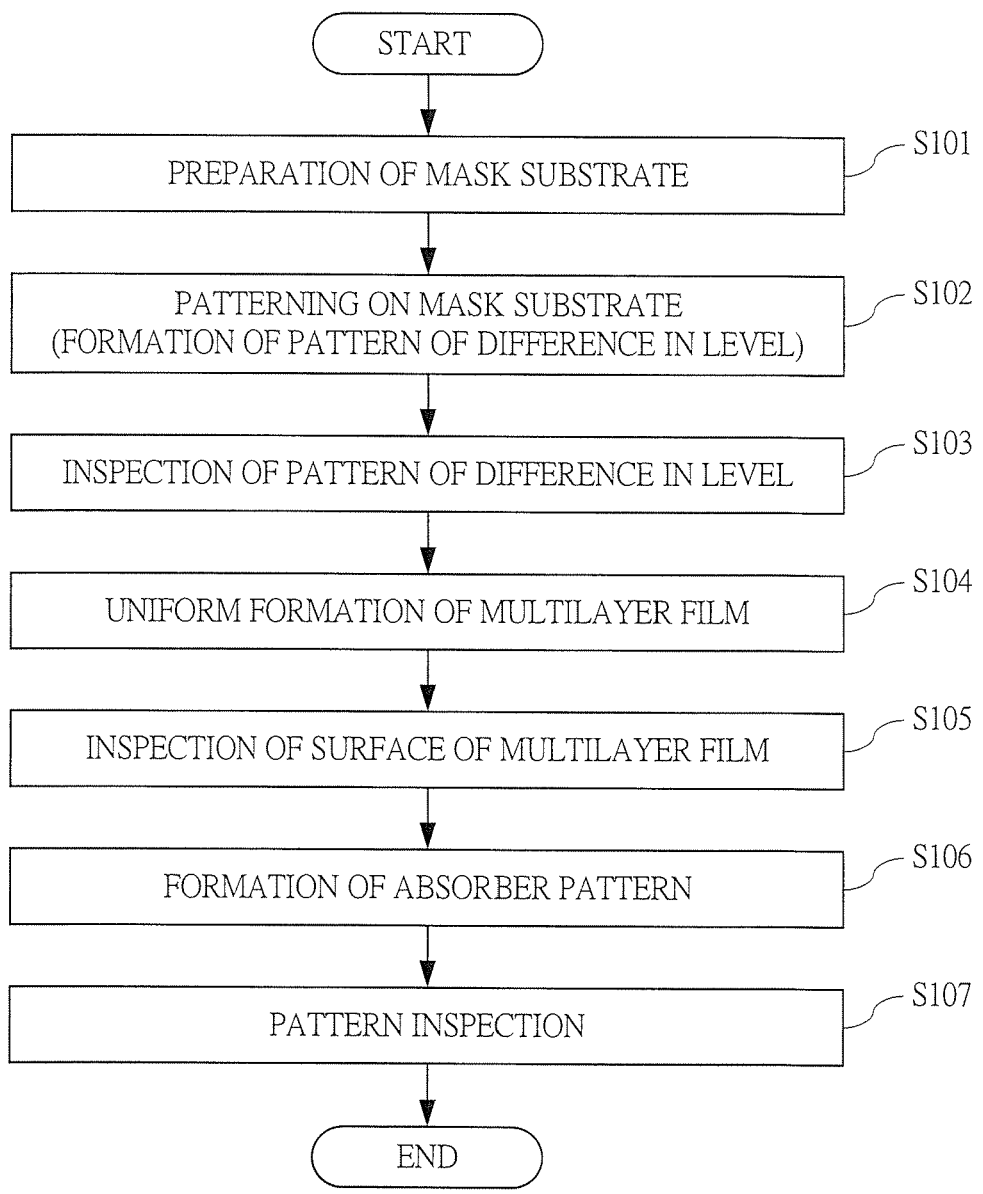
FIG. 18 is a flowchart showing the flow of the manufacturing process of the mask according to the first embodiment.

The manufacturing process of the mask described above is shown as a flowchart in FIG. 18. FIG. 18 is a flowchart showing the flow of the manufacturing process of the mask of the first embodiment. As shown in FIG. 18, first, after preparing the mask substrate (S101), the difference in level (pattern of difference in level) is formed on the mask substrate (S102). Then, the formed difference in level (pattern of difference in level) is inspected (S103), and then, the multilayer film is uniformly formed on the whole surface of the mask substrate on which the difference in level (pattern of difference in level) has been formed (S104). Next, after the surface of the formed multilayer film is inspected (S105), the absorber pattern is formed on the multilayer film (S106). Finally, the formed pattern is inspected (S107).

Here, when defects are found in the inspection process of the pattern of difference in level (S103), the inspection process of the surface of the multilayer film (S105) and the pattern inspection process (S107), whether the correction is possible is examined each time. When it is determined that the correction is possible, after correcting the defect, the subsequent process is carried out. When it is determined that the correction is impossible, the manufacture of the mask is stopped, and a new mask substrate is prepared and the manufacture of the mask is started again. The mask can be manufactured in the above-described manner.

In the first embodiment, as shown in FIG. 14 to FIG. 17, the difference in level DL is formed on the mask substrate MS, and thereafter, the multilayer film MLF with a uniform thickness is formed on the whole surface of the mask substrate MS. As described above, in the first embodiment, the uniform multilayer film MLF is formed on the mask substrate MS having the difference in level DL, and the multilayer film MLF is uniformly formed on the whole surface of the mask substrate MS. Therefore, the shape of the difference in level DL formed on the mask substrate MS is reflected also on the surface of the formed multilayer film MLF. By this means, in the first embodiment, the phase difference of about 180 degrees can be given by the difference in level DL formed on the surface of the multilayer film MLF without changing the material and the cycle length of the multilayer film MLF for each region.

For example, in the prior-art technique for giving the phase difference described in the background of the invention, in order to give the phase difference to the EUV lights reflected from the multilayer films formed in the two regions adjacent to each other, the material of the multilayer film and the cycle length of the film are changed in the two regions adjacent to each other. Furthermore, the phase difference is given to the EUV lights reflected by the two regions adjacent to each other by means of the presence of a thin film provided on the surface of the multilayer film. More specifically, it can be said that the phase difference is ensured by the structure of the multilayer film and the thin film added onto the multilayer film in the prior-art technique.

In these prior-art techniques, when a multilayer film is formed on a mask substrate made of quartz glass or a low thermal expansion material, in order to give the phase difference between adjacent two regions, the material of the multilayer film and the cycle length of the film have to be changed for each region, and the manufacturing process of the mask becomes extremely complicated. On the other hand, in the first embodiment, as shown in FIG. 14 to FIG. 17, the difference in level DL is formed on the mask substrate MS, and the multilayer film MLF with a uniform thickness is formed on the whole surface of the mask substrate MS having the difference in level DL formed thereon. More specifically, in the first embodiment, the multilayer film MLF having the same composition and the same thickness is formed in the first region R1 and the second region R2 which form the difference in level DL therebetween. Therefore, in the manufacturing method of the mask in the first embodiment, in addition to providing the advantages of simplifying the manufacturing process of the multilayer film MLF and improving the yield, sufficient phase difference can be given by the difference in level DL.

In the first embodiment, as shown in FIG. 15, the difference in level DL is formed on the mask substrate MS, and a first method and a second method for forming the difference in level DL on the mask substrate MS will be described below with reference to the drawings.

Figure 19:
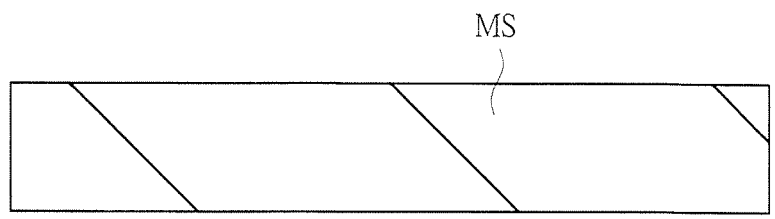
FIG. 19 is a cross-sectional view showing the process of forming the difference in level in the mask according to the first embodiment.
Figure 20:
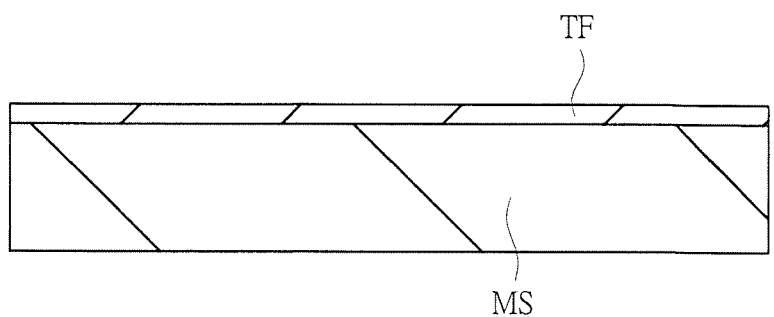
FIG. 20 is a cross-sectional view showing the process of forming the difference in level in the mask continued from FIG. 19.
Figure 21:
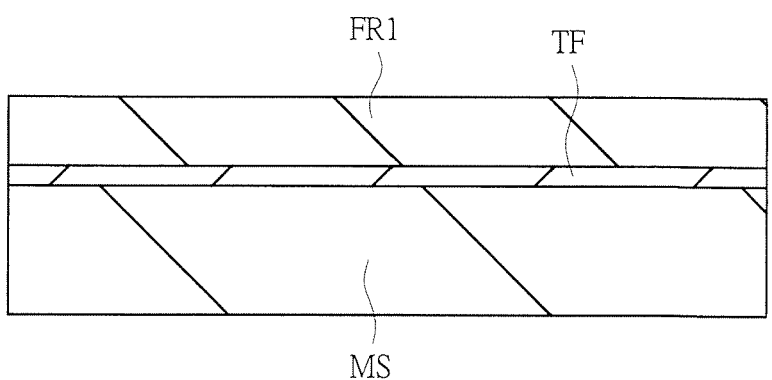
FIG. 21 is a cross-sectional view showing the process of forming the difference in level in the mask continued from FIG. 20.
Figure 22:
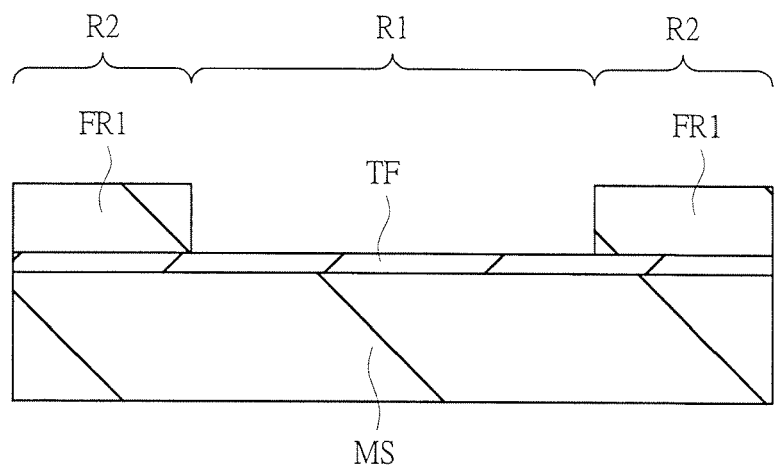
FIG. 22 is a cross-sectional view showing the process of forming the difference in level in the mask continued from FIG. 21.
Figure 23:
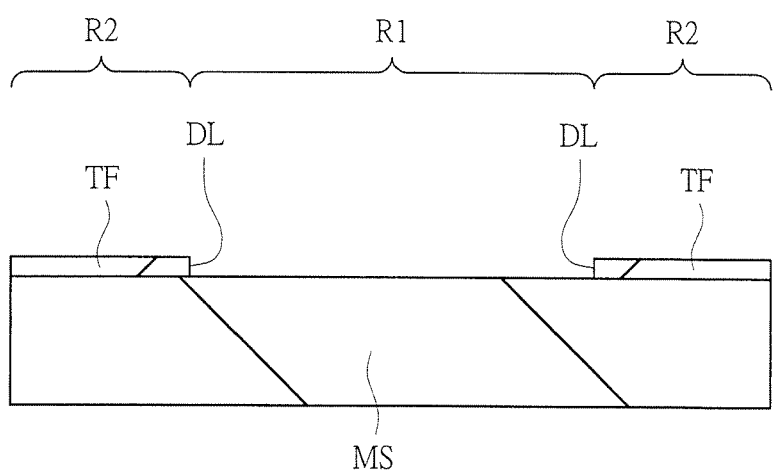
FIG. 23 is a cross-sectional view showing the process of forming the difference in level in the mask continued from FIG. 22.

First, the first method will be described. As shown in FIG. 19, the mask substrate MS made of quartz glass or a low thermal expansion material is prepared. Subsequently, as shown in FIG. 20, a thin film TF is formed on the surface of the mask substrate MS. The thin film TF can be formed from, for example, a silicon oxide film. Thereafter, as shown in FIG. 21, a resist film FR1 is coated on the thin film TF. Then, as shown in FIG. 22, by using the normal photolithography technique, the resist film FR1 is patterned. The patterning of the resist film FR1 is performed in the state where the second region R2 is covered and the first region R1 is exposed. Next, as shown in FIG. 23, the thin film TF exposed from the patterned resist film FR1 is removed by etching, and thereafter, the patterned resist film FR1 is removed. In this manner, the difference in level DL can be formed in the boundary region between the first region R1 and the second region R2. In other words, the thin film TF is formed on the mask substrate MS in the second region R2, and the thin film TF is not formed on the mask substrate MS in the first region R1. Therefore, the height of the second region R2 is larger by the thickness of the thin film TF than the height of the first region R1, and as a result, the difference in level DL can be formed in the boundary region between the first region R1 and the second region R2. The height of the difference in level DL can be adjusted by controlling the thickness of the thin film TF, and the thin film TF is formed so as to have the thickness of one quarter of the wavelength of the EUV light.

Figure 24:
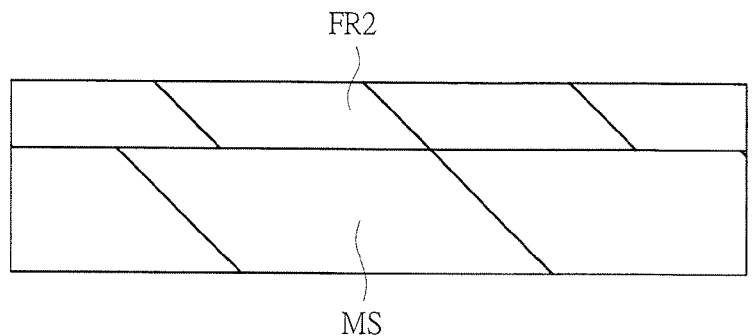
FIG. 24 is a cross-sectional view showing the process of forming the difference in level in the mask according to the first embodiment.
Figure 25:
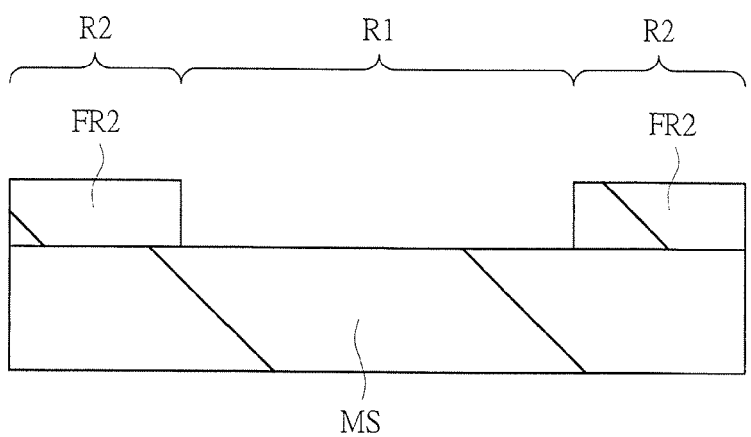
FIG. 25 is a cross-sectional view showing the process of forming the difference in level in the mask continued from FIG. 24.
Figure 26:
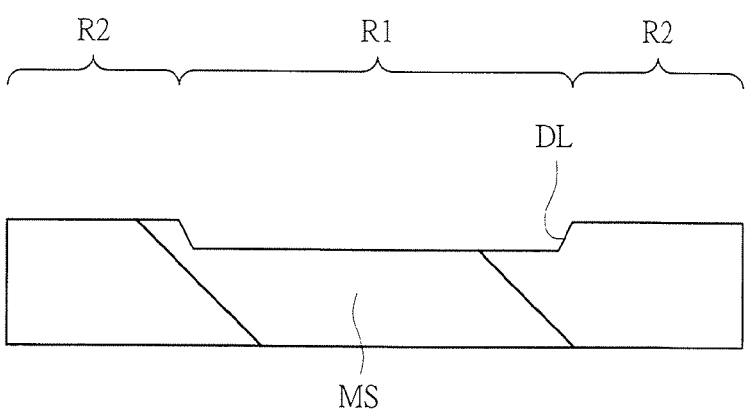
FIG. 26 is a cross-sectional view showing the process of forming the difference in level in the mask continued from FIG. 25.

Next, the second method for forming the difference in level DL on the mask substrate MS will be described. As shown in FIG. 24, the mask substrate MS made of quartz glass or a low thermal expansion material is prepared. Then, a resist film FR2 is coated on this mask substrate MS. Subsequently, as shown in FIG. 25, by using the normal photolithography technique, the resist film FR2 is patterned. The patterning of the resist film FR2 is performed in the state where the second region R2 is covered and the first region R1 is exposed. Thereafter, as shown in FIG. 26, the mask substrate MS exposed from the patterned resist film FR2 is etched, thereby forming a groove in the first region R1 of the mask substrate MS. In this manner, the difference in level DL can be formed in the boundary region between the first region R1 and the second region R2. In other words, the groove is not formed on the mask substrate MS in the second region R2 and the groove is formed on the mask substrate MS in the first region R1. Therefore, the height of the second region R2 is larger by the depth of the groove than the height of the first region R1, and as a result, the difference in level DL can be formed in the boundary region between the first region R1 and the second region R2. The height of the difference in level DL can be adjusted by controlling the depth of the groove, and the groove is formed so as to have the depth of one quarter of the wavelength of the EUV light.

In the above-described manner, the difference in level DL can be formed on the mask substrate MS by using the first method or the second method. Here, although the number of steps in the second method seems to be smaller than that of the first method, the etching control at the time of forming the groove in the mask substrate MS is rather difficult. However, when the time control of the etching amount for forming the groove can be precisely done, it is possible to adopt the second method.

Second Embodiment

In the second embodiment, an example where high-density hole patterns are formed by using the mask manufactured in the first embodiment will be described. Similar to the first embodiment described above, the technique described in the second embodiment is based on the lithography technique in which EUV light is used and an exposure optical system in which the EUV light is obliquely incident on the mask is used.

Figure 27A:
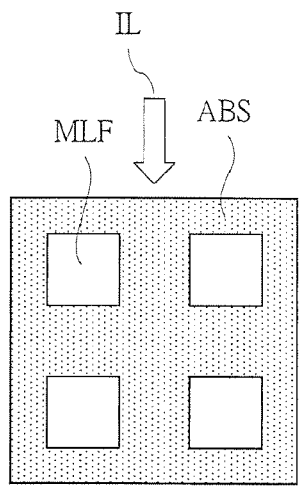
FIG. 27A shows a mask structure of a comparative example 1.
Figure 27B:
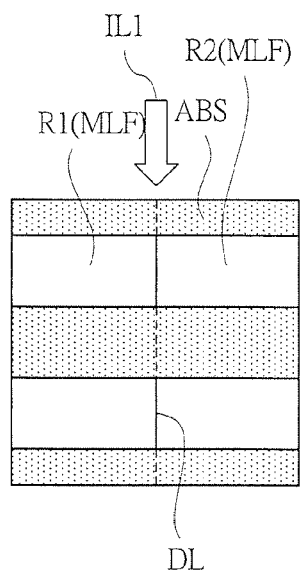
FIG. 27B shows a mask structure of a comparative example 2 and FIG. 27C shows a mask structure of an example of the present invention.
Figure 27C:
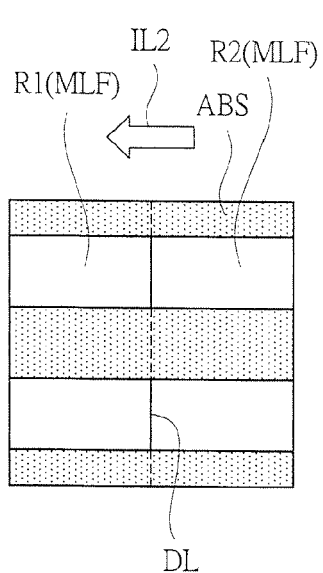

FIG. 27 is a diagram showing a part of a mask (corresponding to four holes) used for forming high-density hole patterns and an incident direction of an exposure light (incident light) on a mask surface. FIG. 27A shows a mask structure of a comparative example 1, in which four hole patterns are formed in the absorber ABS and the multilayer film MLF is exposed as a reflection region in the four hole patterns. The incident direction of the exposure light (incident light IL0) on the mask surface is as shown in FIG. 27A. FIG. 27B is a mask structure shown in the first embodiment described above, in which four hole patterns are formed. More specifically, the difference in level DL is formed in the boundary region between the first region R1 and the second region R2, and the absorber ABS is formed so as to extend in the direction orthogonal to the extending direction of the difference in level DL. The incident direction of the exposure light (incident light IL1) on the mask surface is as shown in FIG. 27B, and it is orthogonal to the longitudinal direction of the absorber ABS. The example shown in FIG. 27B is taken as a comparative example 2. FIG. 27C is a mask structure shown in the first embodiment described above, in which four hole patterns are formed. More specifically, the difference in level DL is formed in the boundary region between the first region R1 and the second region R2, and the absorber ABS is formed so as to extend in the direction orthogonal to the extending direction of the difference in level DL. The incident direction of the exposure light (incident light IL2) on the mask surface is as shown in FIG. 27C, and it is parallel to the longitudinal direction of the absorber ABS and is orthogonal to the difference in level DL. The example shown in FIG. 27C is taken as an example of the present invention.

In the second embodiment, for transferring the mask pattern onto a semiconductor substrate (resist film) by using the projection exposure apparatus with a numerical aperture NA=0.25, modified illumination is adopted in order to bring the maximum resolution performance from both the pattern by the absorber ABS and the pattern by the difference in level DL (phase shift pattern).

Figure 28A:
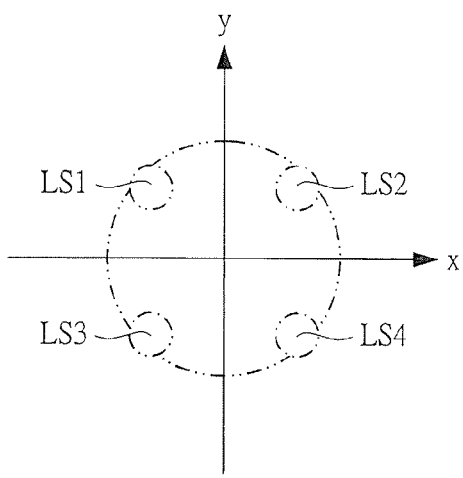
FIG. 28A shows the quadrupole illumination and FIG. 28B shows the dipole illumination.
Figure 28B:
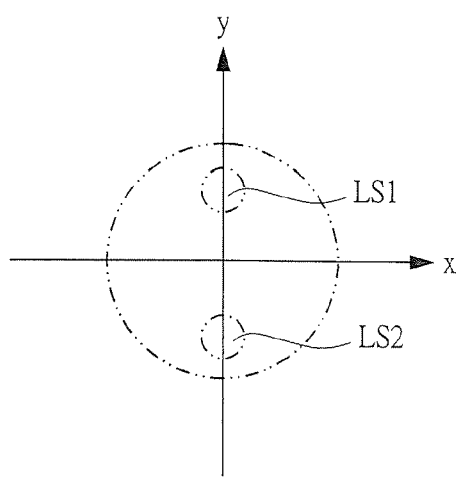

FIG. 28 is a diagram showing the shape of the effective light source. FIG. 28A shows the quadrupole illumination in which four light sources LS1 to LS4 are arranged axisymmetrically near the outline of the illumination σ=1, and it is adopted in the comparative example 1 shown in FIG. 27A. Strictly speaking, the incident directions from these light sources to the mask differ because there are four light sources, but the average illumination direction thereof is expressed by the incident light IL shown in FIG. 27A. On the other hand, FIG. 28B shows the dipole illumination in which two light sources LS1 and LS2 are arranged at separate positions in the y direction, and the average illumination direction thereof is adopted as the incident light IL1 in the second comparative example shown in FIG. 27B and also as the incident light IL2 in the example of the present invention shown in FIG. 27C. The shape of the effective light source shown in FIG. 28B is the strong modified illumination as the dipole illumination for the pattern (line pattern) by the absorber ABS, and it gives small illumination σ for the pattern (phase shift pattern) by the difference in level DL. Therefore, the effective light source shown in FIG. 28B is the modified illumination capable of bringing the maximum resolution performance from both the pattern by the absorber ABS and the pattern (phase shift pattern) by the difference in level DL. In the example of the present invention, the illumination light source of the example of the present invention that irradiates the EUV light is constituted of a pair of light sources arranged separately by a predetermined distance in the second direction (y direction) in which the difference in level DL extends.

Figure 29C:
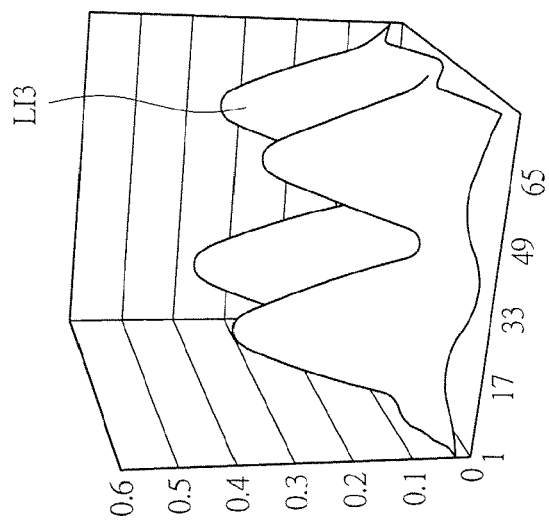
FIG. 29A to FIG. 29C are diagrams showing the light intensity distribution in the projection image of the high-density hole patterns obtained by using the mask patterns shown in FIG. 27A to FIG. 27C and the illumination light sources shown in FIG. 28A and FIG. 28B, respectively.
Figure 29B:
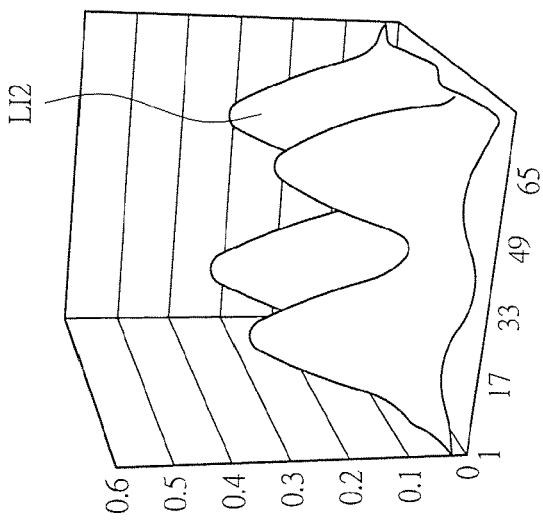
Figure 29A:
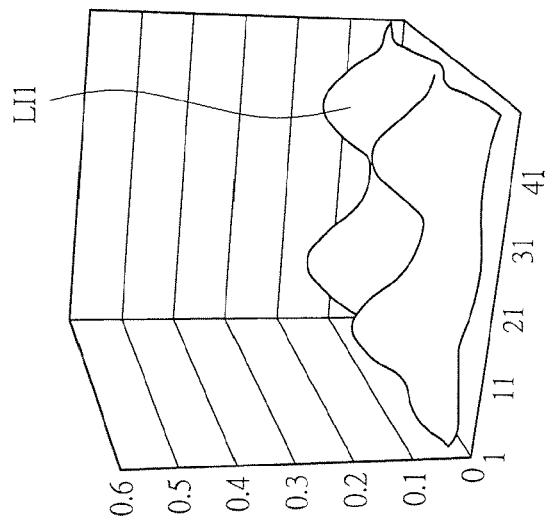

Under such conditions, the light intensity distribution in the projection image of the high-density hole patterns is calculated. FIG. 29A to FIG. 29C are diagrams showing the light intensity distribution in the projection image of the high-density hole patterns obtained by using the mask patterns shown in FIG. 27A to FIG. 27C and the illumination light sources shown in FIG. 28A and FIG. 28B, respectively. In the second embodiment, the pattern with the pitch of 40 nm and the size of 20 nm is adopted as the high-density hole patterns. As shown in FIG. 29A to FIG. 29C, it can be understood that the light intensity distributions LI2 and LI3 of the hole patterns shown in FIG. 29B and FIG. 29C are larger compared with the light intensity distribution LI1 of the hole patterns shown in FIG. 29A. This indicates that the contrast of the projection image can be improved and the resolution performance can be improved in the comparative example 2 and the example of the present invention in which the hole patterns are formed by the absorber ABS and the difference in level DL in comparison to the comparative example 1 in which the hole patterns are formed by only the absorber ABS.

Furthermore, when comparing the light intensity distribution of the comparative example 2 shown in FIG. 293 and the light intensity distribution of the example of the present invention shown in FIG. 29C, the light intensity distribution LI3 of the example of the present invention is larger than the light intensity distribution LI2 of the comparative example 2, and it can be understood that the contrast of the projection image can be improved to a maximum extent in the example of the present invention. In other words, by combining the absorber ABS, the difference in level DL for giving the phase shift pattern and the incident direction of the exposure light (incident light IL2) on the mask surface in the manner defined in the example of the present invention, the maximum resolution performance can be achieved.

The patterns repeated in the x axis direction and the y axis direction like the high-density hole patterns can be formed by only the phase shift pattern by the difference in level DL without forming the absorber ABS. However, when the pitch of the hole patterns is narrowed, the phase difference of 180 degrees operates so as to cancel the whole incident light, and the contrast of the projection image is reduced. Also, in the case where the control of the size of the hole patterns is required when the actual pattern is formed, the control is difficult if the phase shift pattern by the difference in level DL only is formed. However, if the pattern by the absorber ABS is adopted, the size of the hole pattern can be easily controlled by controlling the width of the absorber ABS. Further, even though the region where the minute pattern is to be formed can be formed only by the phase shift pattern, the region from the peripheral portion of the pattern group to the actual edge portion of the mask is covered with a large-sized absorber ABS. In consideration of these facts, it can be understood that the exposure method in the example of the present invention, in which the phase shift pattern by the difference in level DL and the absorber pattern by the absorber ABS are combined, the longitudinal direction of the absorber pattern is matched with the incident direction of the incident light on the mask surface, and the extending direction of the difference in level DL is set to be orthogonal to the incident direction of the incident light on the mask surface, is optimum from the standpoint of improving the resolution performance.

In the second embodiment, the absorber ABS and the difference in level DL are formed, and the projective component projected on the mask surface out of the direction cosine component of the incident light is set to be almost orthogonal to the extending direction of the difference in level DL. By this means, the formation of the shadow region caused by the absorber ABS can be suppressed in the whole region of the mask. More specifically, the technical idea of the second embodiment is characterized in that the dark portion extending in the direction intersecting with the projection direction of the incident light is formed by the difference in level DL instead of the absorber ABS. Since the absorber ABS with large height can be replaced with the difference in level DL whose height is almost negligible, the formation of the shadow region can be suppressed. As a result, in the lithography technique in which the EUV light is used and the exposure optical system in which the EUV light is obliquely incident on the mask is used, the contrast of the projection image can be improved, and as a result, the maximum resolution performance can be achieved. Accordingly, the dimensional accuracy of the pattern transferred onto the semiconductor substrate (resist film) can be improved.

Third Embodiment

In the third embodiment, the manufacturing process of a semiconductor device including the process of forming the high-density hole patterns by using the mask manufactured in the first embodiment described above will be described with reference to the drawings. Similar to the first embodiment described above, the technique of forming the high-density hole patterns is based on the lithography technique in which EUV light is used and an exposure optical system in which the EUV light is obliquely incident on the mask is used.

Figure 30:
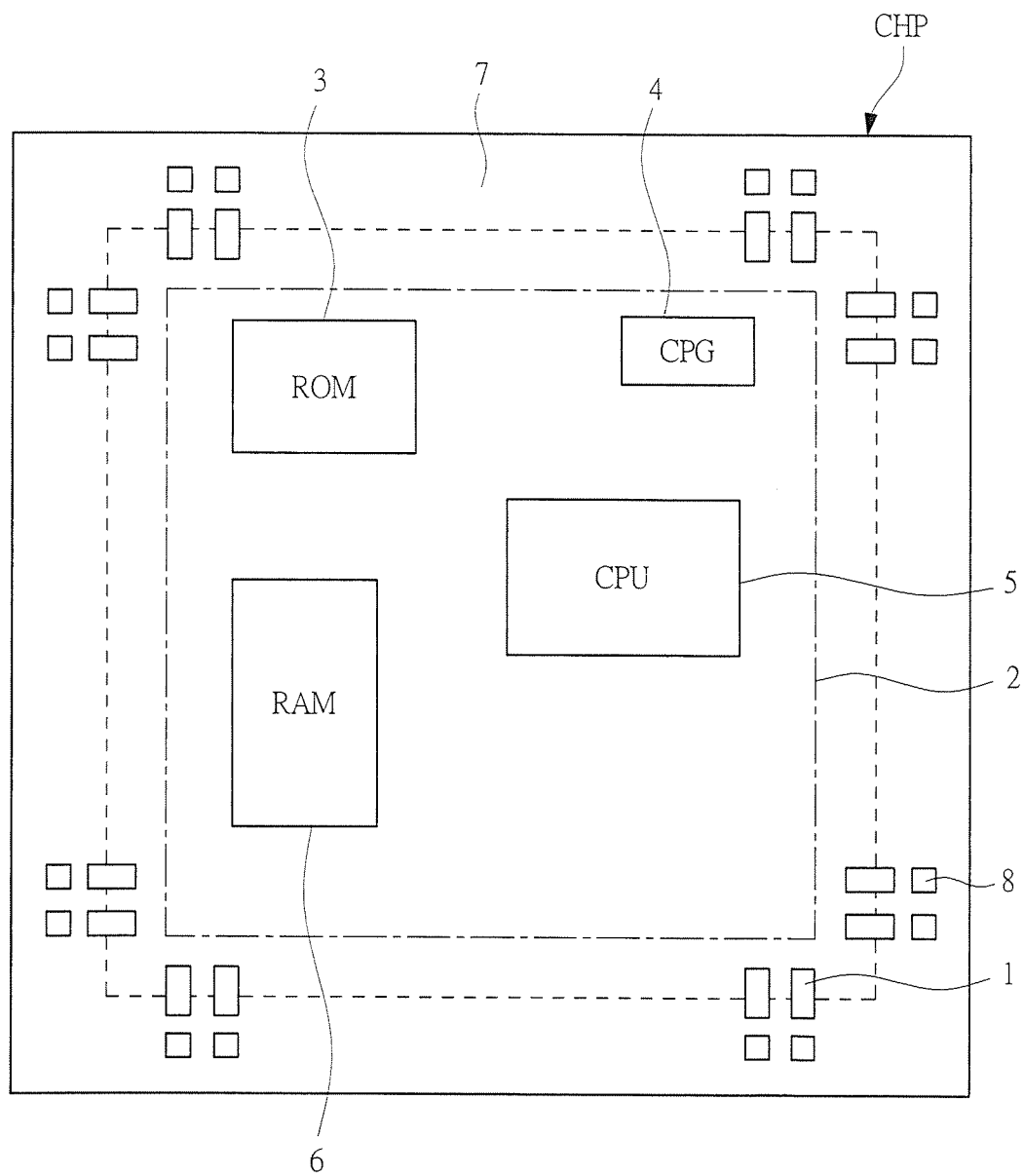
FIG. 30 is a diagram showing a schematic layout structure of a whole semiconductor chip in the third embodiment.

FIG. 30 is a diagram showing a schematic layout structure of a whole semiconductor chip CHP in the third embodiment. In FIG. 30, an input-output circuit 1 is a circuit for providing an interface between an internal circuit region 2 including an internal circuit (core circuit) formed in an internal region of the semiconductor chip CHP and an external circuit formed outside the semiconductor chip CHP. A read only memory (ROM) 3, a clock pulse generator (CPG) 4, a central processing unit (CPU) 5, a random access memory (RAM) 6 and others are formed in the internal circuit region 2, and a random logic, bus and others are formed in the other region. In a bonding pad/input-output circuit region 7, a bonding pad 8 and the input-output circuit 1 are provided.

For example, the CPU (circuit) 5 is also referred to as a central processing unit, and it corresponds to the heart of a computer or others. This CPU 5 decodes an instruction read from a storage device and performs various types of operations and controls based on the instruction, and the high-speed processing is required.

The RAM (circuit) 6 is a memory that can randomly read and write information, that is, a memory that can read the stored information and can newly write the storage information at any time, and it is also referred to as a random access memory. As the RAM for an IC memory, there are two types of RAMs such as a DRAM (Dynamic RAM) using a dynamic circuit and a SRAM (Static RAM) using a static circuit. The DRAM is a random access memory that requires the memory holding operation, and the SRAM is a random access memory that does not require the memory holding operation.

Figure 31:
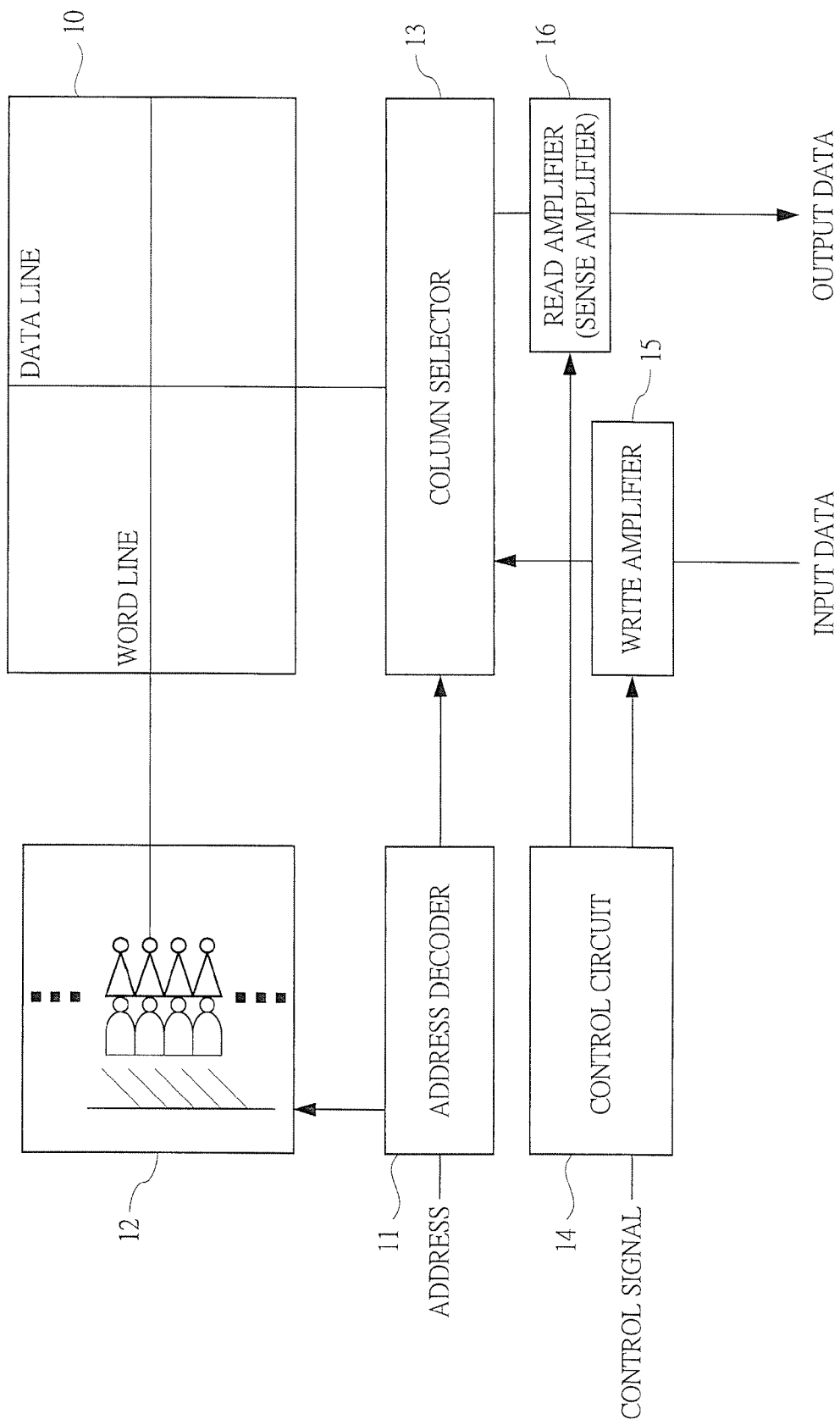
FIG. 31 is a diagram showing the configuration of the memory module in the third embodiment.

The configuration of a memory module constituting the RAM in the third embodiment will be described below. FIG. 31 is a diagram showing the configuration of the memory module in the third embodiment. In FIG. 31, the memory module in the third embodiment includes a memory cell array 10, an address decoder 11, a word driver 12, a column selector 13, a control circuit 14, a write amplifier 15 and a read amplifier 16.

The memory cell array 10 is constituted of a plurality of memory cells, in which the plurality of memory cells are disposed in a matrix. Each of the memory cells constituting the memory cell array 10 is a storage element that stores information, and a large capacity of information can be stored by storing information in the plurality of memory cells. The memory cell constituting the memory cell array 10 is, for example, a memory cell of the SRAM (Static Random Access Memory). In the memory cell array 10, a plurality of word lines are arranged in a row direction and a plurality of data lines are arranged in a column direction as shown in FIG. 31.

Further, memory cells are disposed at crossing regions between the word lines and the data lines.

In the address decoder 11, addresses are inputted and the address to be selected is analyzed. Then, the address decoder outputs the row component of the analyzed address (row address) to the word driver 12 and outputs the column component of the analyzed address (column address) to the column selector 13.

The row address is inputted from the address decoder 11 to the word driver 12, and the word driver 12 selects a specified word line. Also, the column address is inputted from the address decoder 11 to the column selector 13, and the column selector 13 selects a specified data line.

The control circuit 14 controls the write operation and the read operation of the memory cell constituting the memory cell array 10, and the write amplifier 15 has a function to output the input data to the column selector 13. Meanwhile, the data read from the column selector 13 is inputted to the read amplifier 16, and the read amplifier 16 amplifies the inputted data and then outputs the amplified data.

The memory module in the third embodiment has the configuration as described above, and the operation thereof will be described below. First, the write operation will be described. The address analysis is performed by the address decoder 11, and the row address obtained by the analysis is outputted to the word driver 12 and the column address is outputted to the column selector 13. In the word driver 12, a specified word line is selected based on the inputted row address. On the other hand, in the column selector 13, a specified data line is selected based on the inputted column address. In this manner, the memory cell disposed in the region where the specified word line and the specified data line are crossed is selected. At this time, the write amplifier 15 is activated by the signal from the control circuit 14, and in the activated write amplifier 15, the input data is inputted and the input data is outputted to the column selector 13. In the column selector 13, the input data is outputted to the specified data line, so that the input data is outputted to the selected memory cell, thereby performing the write operation.

Subsequently, the read operation will be described. The address analysis is performed by the address decoder 11, and the row address obtained by the analysis is outputted to the word driver 12 and the column address is outputted to the column selector 13. In the word driver 12, a specified word line is selected based on the inputted row address. On the other hand, in the column selector 13, a specified data line is selected based on the inputted column address. In this manner, the memory cell disposed in the region where the specified word line and the specified data line are crossed is selected. At this time, the read amplifier 16 is activated by the signal from the control circuit 14. In the column selector 13, the output data read from the specified data line is outputted to the activated read amplifier 16. In the read amplifier 16, the inputted output data is amplified, and then, the amplified output data is outputted to the outside. The read operation is performed in the above-described manner.

In the semiconductor chip CHP having the above-described configuration, the layout of a logic circuit constituting the CPU 5, the layout constituting the memory cell array 10 of the SRAM, and the layout constituting the peripheral circuit of the SRAM (address decoder 11, word driver 12, column selector 13, control circuit 14, write amplifier 15, read amplifier 16 and others) will be described.

Figure 32:
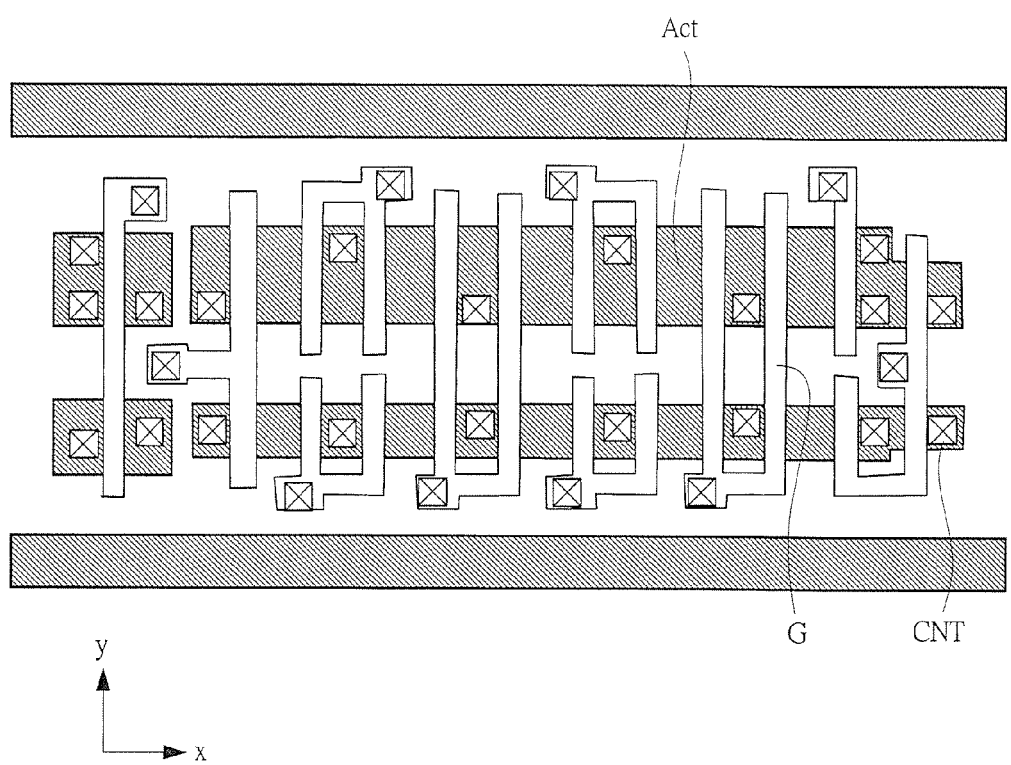
FIG. 32 is a diagram showing an example of the layout of a logic circuit constituting the CPU.

FIG. 32 is a diagram showing an example of the layout of a logic circuit constituting the CPU 5. As shown in FIG. 32, an active region Act is formed so as to extend in the x axis direction and a gate electrode G extends in the y axis direction so as to intersect with the active region Act. In the region where the active region Act and the gate electrode G are planarly overlapped, a MISFET (Metal Insulator Semiconductor Field Effect Transistor) is formed. The active region Act is a region to be a source region and a drain region of a MISFET and is electrically connected to a wiring via a contact hole CNT (specifically, plug obtained by filling the contact hole CNT with a conductive material). Similarly, the gate electrode G is also electrically connected to the wiring via the contact hole CNT (specifically, plug).

Figure 33:
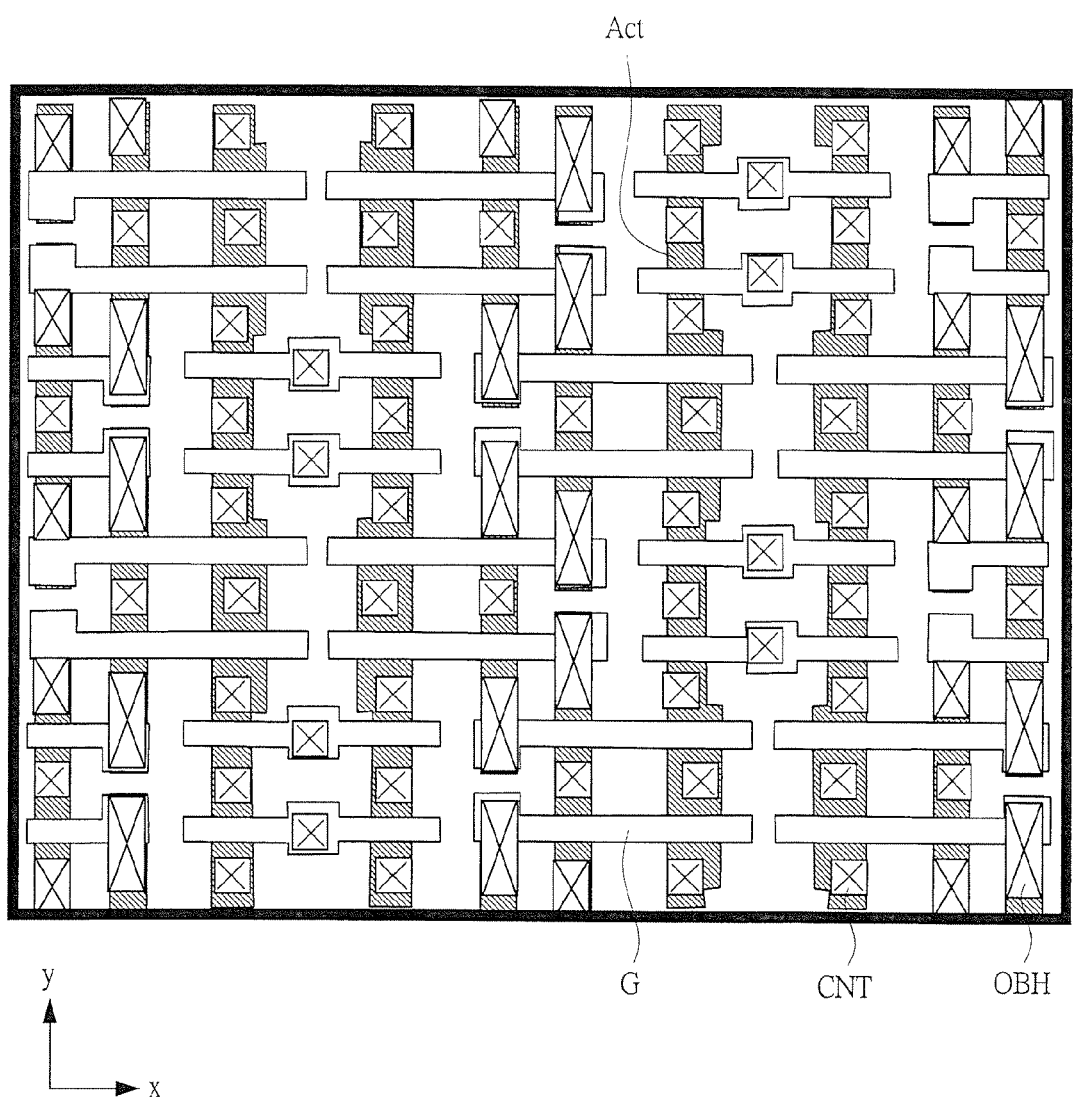
FIG. 33 is a diagram showing an example of the layout constituting the memory cell array of the RAM.

Subsequently, FIG. 33 is a diagram showing an example of the layout constituting the memory cell array 10 of the RAM 6 (SRAM). As shown in FIG. 33, the active region Act is formed so as to extend in the y axis direction, and the gate electrode G extends in the x axis direction so as to intersect with the active region Act. In the region where the active region Act and the gate electrode G are planarly overlapped, a MISFET (Metal Insulator Semiconductor Field Effect Transistor) is formed. The active region Act is a region to be a source region and a drain region of a MISFET and is electrically connected to a wiring via a contact hole CNT (specifically, plug obtained by filling the contact hole CNT with a conductive material). Similarly, the gate electrode G is also electrically connected to the wiring via the contact hole CNT (specifically, plug). Further, a rectangular hole (plug) OBH for the wiring is also provided.

Figure 34:
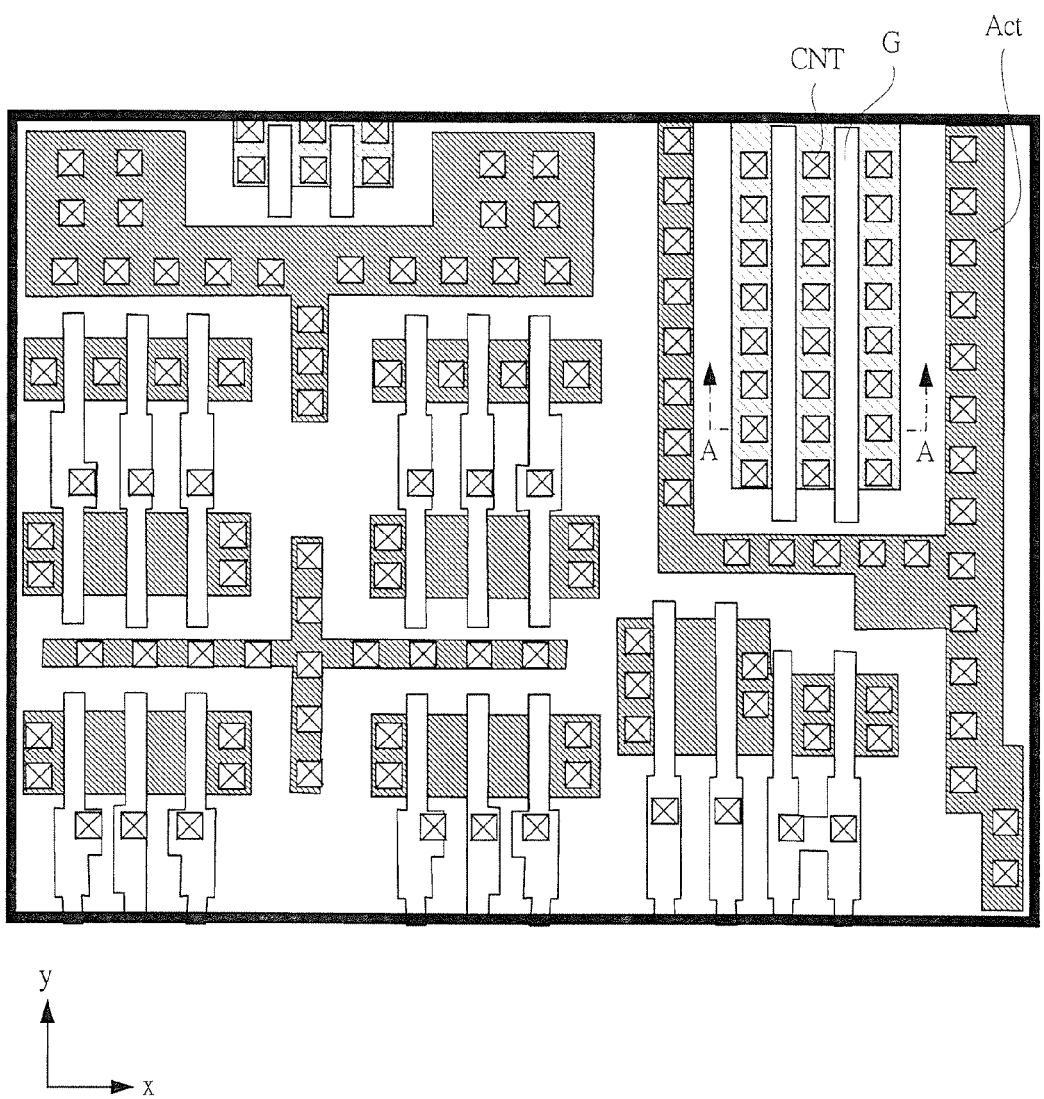
FIG. 34 is a diagram showing an example of the layout constituting the peripheral circuit of the RAM.

Next, FIG. 34 is a diagram showing an example of the layout constituting the peripheral circuit of the RAM 6 (SRAM). As shown in FIG. 34, the active region Act is formed so that components extending in the y axis direction and those extending in the x axis direction are mixedly present, and the gate electrode G is formed on the active region Act. In the region where the active region Act and the gate electrode G are planarly overlapped, a MISFET (Metal Insulator Semiconductor Field Effect Transistor) is formed. The active region Act is a region to be a source region and a drain region of a MISFET and is electrically connected to a wiring via a contact hole CNT (specifically, plug obtained by filling the contact hole CNT with a conductive material). Similarly, the gate electrode G is also electrically connected to the wiring via the contact hole CNT (specifically, plug).

From FIG. 32 showing the layout of the logic circuit, FIG. 33 showing the layout of the memory cell array of the SRAM and FIG. 34 showing the layout of the peripheral circuit of the SRAM, it can be understood that contact holes formed in the layout of the peripheral circuit of the SRAM are most densely packed. Therefore, the present invention is applied when forming the peripheral circuit of the SRAM in which contact holes are densely arranged. More specifically, the case where the present invention is applied to the formation of contact hole patterns shown in FIG. 34 based on the lithography technique in which EUV light is used and an exposure optical system in which the EUV light is obliquely incident on the mask is used will be described.

Figure 35:
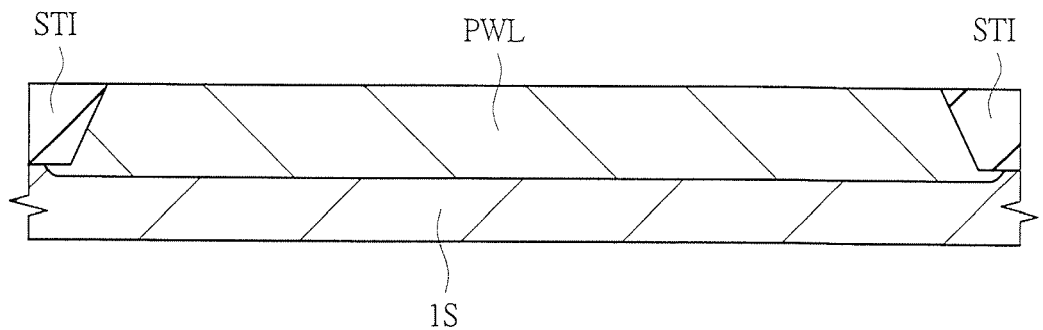
FIG. 35 is a cross-sectional view showing the manufacturing process of a semiconductor device according to the third embodiment.

The manufacturing process of a semiconductor device according to the third embodiment will be described below. In the description below, basically, a cross-sectional view taken along the ling A-A in FIG. 34 is used. First, as shown in FIG. 35, a semiconductor substrate 1S made of single crystal silicon to which a p type impurity such as boron (B) is implanted is prepared. At this time, the semiconductor substrate 1S is in a state of a semiconductor wafer with a substantially circular shape. Then, element isolation regions STI for isolating the elements are formed in the MISFET formation region of the semiconductor substrate 1S. The element isolation region STI is provided so that the elements do not interfere with each other. The element isolation region STI can be formed by using, for example, the LOCOS (Local Oxidation of Silicon) method and the STI (Shallow Trench Isolation) method. For example, in the STI method, the element isolation region STI is formed in the following manner. That is, element isolation trenches are formed in the semiconductor substrate 1S by using the photolithography technique and the etching technique. Then, a silicon oxide film is formed on the semiconductor substrate so as to fill the element isolation trenches, and then, the unnecessary silicon oxide film formed on the semiconductor substrate is removed by the chemical mechanical polishing (CMP). In this manner, the element isolation regions STI in which the silicon oxide film is filled only in the element isolation trenches can be formed.

Next, an impurity is implanted into the active region isolated by the element isolation regions STI, thereby forming a well. For example, a p type well PWL is formed in the n channel MISFET formation region of the active region. The p type well PWL is formed by implanting a p type impurity such as boron into the semiconductor substrate by the ion-implantation method.

Subsequently, a semiconductor region (not shown) for channel formation is formed in a surface region of the p type well PWL. The semiconductor region for channel formation is formed in order to adjust the threshold voltage for forming the channel.

Figure 36:
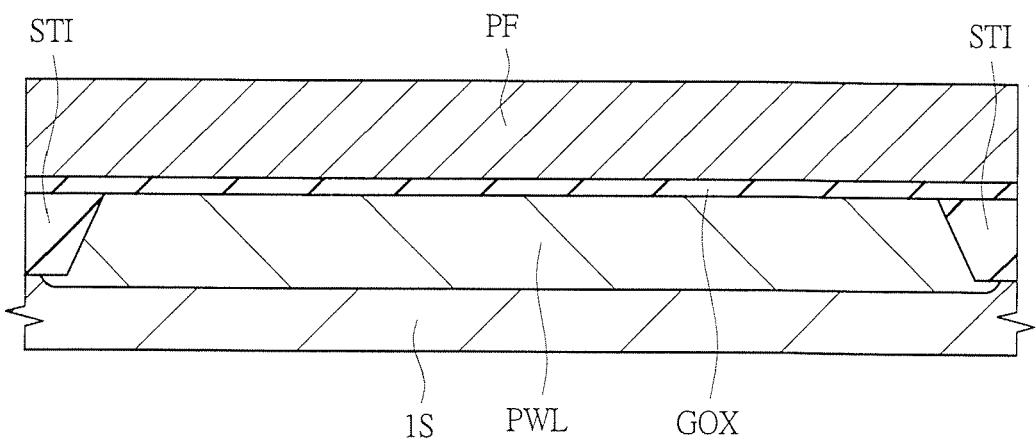
FIG. 36 is a cross-sectional view showing the manufacturing process of the semiconductor device continued from FIG. 35.

Next, as shown in FIG. 36, a gate insulating film GOX is formed on the semiconductor substrate 1S. The gate insulating film GOX is made of, for example, a silicon oxide film and can be formed by using, for example, the thermal oxidation method. However, the gate insulating film GOX is not limited to a silicon oxide film, but various kinds of materials can be used thereto. For example, the gate insulating film GOX can be made of a silicon oxynitride film (SiON). Further, the gate insulating film GOX may be made of a high dielectric constant film having a dielectric constant higher than that of a silicon oxide film. When a material having a dielectric constant higher than that of a silicon oxide film is used, the physical thickness can be increased without changing the capacitance. As described above, when the high dielectric constant film is used, the physical thickness can be increased without changing the capacitance, and therefore, the leakage current can be reduced.

Subsequently, a polysilicon film PF is formed on the gate insulating film GOX. The polysilicon film PF can be formed by using, for example, the CVD method. Then, an n type impurity such as phosphorus or arsenic is implanted into the polysilicon film PF formed in the n channel MISFET formation region by using the photolithography technique and the ion-implantation method.

Figure 37:
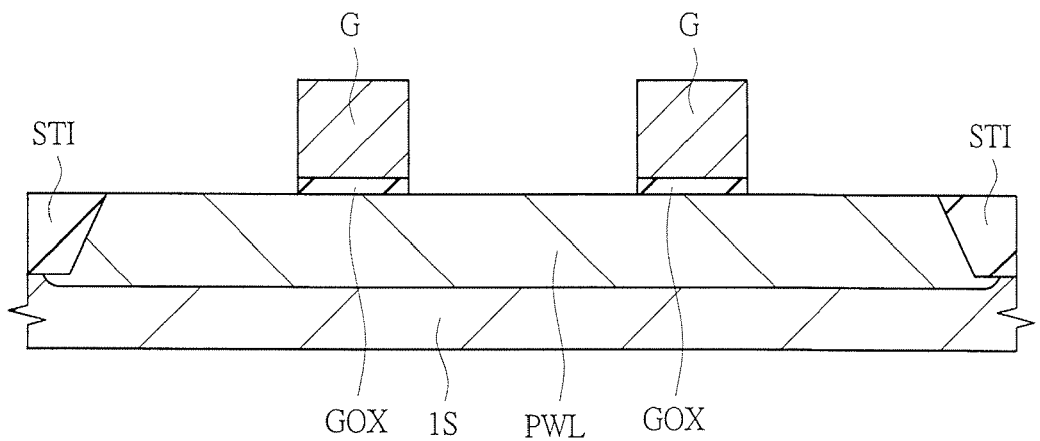
FIG. 37 is a cross-sectional view showing the manufacturing process of the semiconductor device continued from FIG. 36.

Next, as shown in FIG. 37, the polysilicon film PF is processed by the etching using the patterned resist film as a mask, thereby forming gate electrodes G in the n channel MISFET formation region.

In the gate electrode G in the n channel MISFET formation region mentioned here, an n type impurity is implanted into the polysilicon film PF. Therefore, since the work function value of the gate electrode G can be set to a value close to the conduction band of silicon (4.15 eV), the threshold voltage of the n channel MISFET can be reduced.

Figure 38:
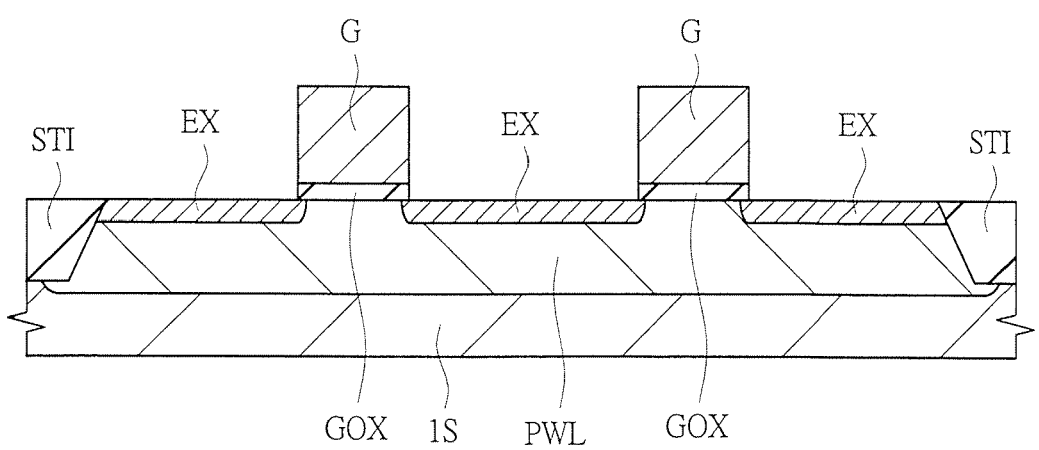
FIG. 38 is a cross-sectional view showing the manufacturing process of the semiconductor device continued from FIG. 37.

Subsequently, as shown in FIG. 38, by using the photolithography technique and the ion implantation method, shallow n type impurity diffusion regions EX aligned with the gate electrode G of the n channel MISFET are formed. The shallow n type impurity diffusion region EX is a semiconductor region.

Figure 39:
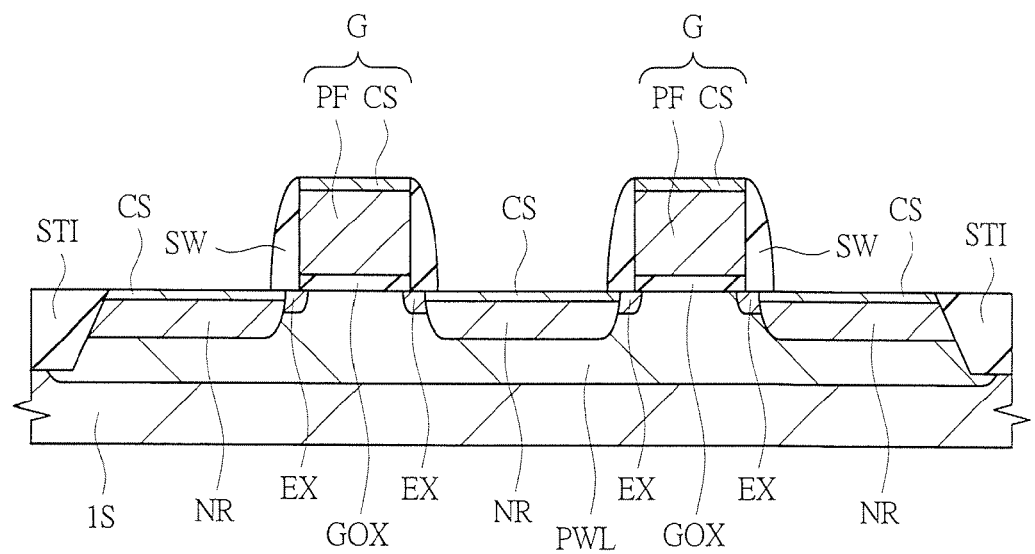
FIG. 39 is a cross-sectional view showing the manufacturing process of the semiconductor device continued from FIG. 38.

Next, as shown in FIG. 39, a silicon oxide film is formed on the semiconductor substrate 1S. The silicon oxide film can be formed by using, for example, the CVD method. Then, the silicon oxide film is anisotropically etched to form sidewalls SW on the side walls of the gate electrodes G. Although the sidewall SW is made of a single film of a silicon oxide film, the sidewall SW is not limited to this, and the sidewall SW may be made of, for example, a stacked film of a silicon nitride film and a silicon oxide film.

Subsequently, deep n type impurity diffusion regions NR aligned with the sidewall SW are formed in the n channel MISFET formation region by using the photolithography technique and the ion implantation method. The deep n type impurity diffusion region NR is a semiconductor region. A source region is formed by the deep n type impurity diffusion region NR and the shallow n type impurity diffusion region EX. Similarly, a drain region is formed by the deep n type impurity diffusion region NR and the shallow n type impurity diffusion region EX. Since the source region and the drain region are formed by the shallow n type impurity diffusion regions EX and the deep n type impurity diffusion regions NR, the source region and the drain region can have the LDD (Lightly Doped Drain) structure.

After the deep n type impurity diffusion regions NR are formed in the above-described manner, the heat treat at about 1000° C. is carried out. By this means, the implanted impurities are activated.

Thereafter, a cobalt film is formed on the semiconductor substrate 1S. At this time, the cobalt film is formed so as to be in direct contact with the gate electrode G. Similarly, the cobalt film is in direct contact with the deep n type impurity diffusion region NR.

The cobalt film can be formed by using, for example, the sputtering method. Then, by performing the heat treatment after forming the cobalt film, the polysilicon film PF constituting the gate electrode G and the cobalt film are reacted to form a cobalt silicide film CS. In this manner, the gate electrode G has a stacked layer structure of the polysilicon film PF and the cobalt silicide film CS. The cobalt silicide film CS is formed for the resistance reduction of the gate electrode G. Similarly, by the above-described heat treatment, the silicon and the cobalt film are reacted also on the surface of the deep n type impurity diffusion region NR, and the cobalt silicide film CS is formed. Therefore, the resistance reduction can be achieved also in the deep n type impurity diffusion region NR.

Next, the unreacted cobalt film is removed from the surface of the semiconductor substrate 1S. Note that, although the cobalt silicide film CS is formed in the third embodiment, a nickel silicide film or a titanium silicide film may be formed instead of the cobalt silicide film CS.

Figure 40:
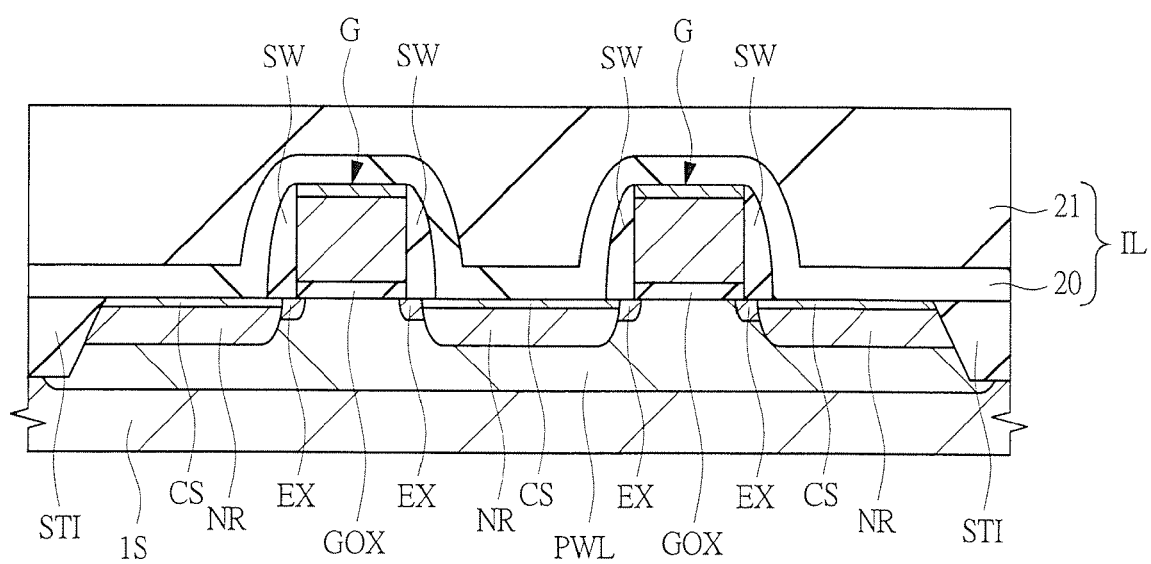
FIG. 40 is a cross-sectional view showing the manufacturing process of the semiconductor device continued from FIG. 39.

Next, as shown in FIG. 40, a silicon nitride film 20 and a silicon oxide film 21 to be an interlayer insulating film IL are formed on the main surface of the semiconductor substrate 1S. This silicon nitride film 20 can be formed by using, for example, the CVD method. Also, the silicon oxide film 21 can be formed by using, for example, the CVD method using TEOS (Tetra Ethyl Ortho Silicate) as a material. Thereafter, the surface of the silicon oxide film 21 is planarized by using, for example, the CMP (Chemical Mechanical Polishing) method.

Figure 41:
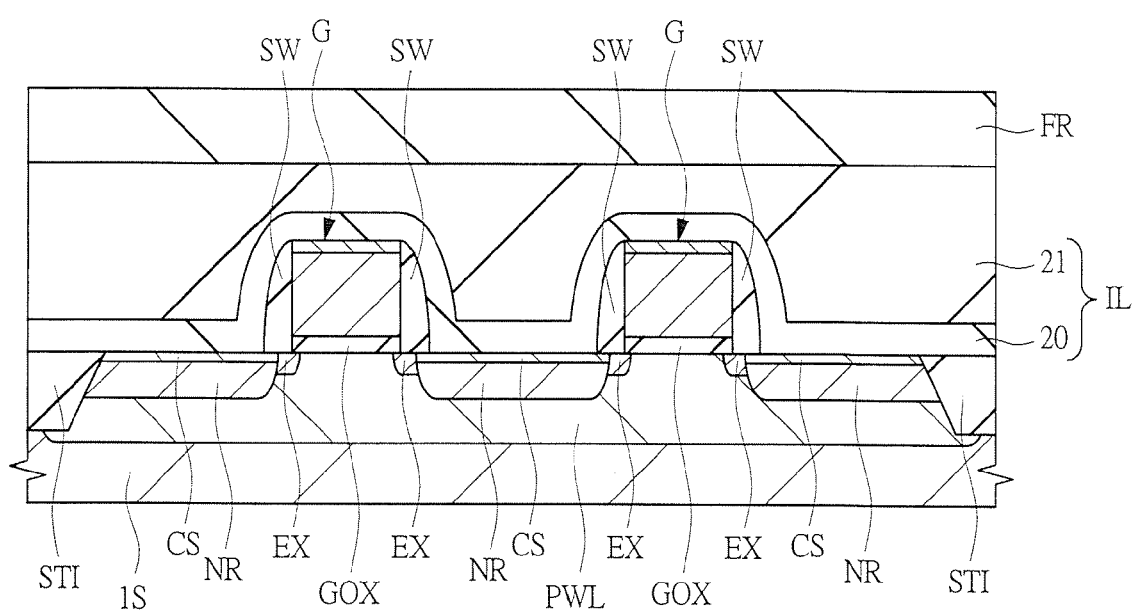
FIG. 41 is a cross-sectional view showing the manufacturing process of the semiconductor device continued from FIG. 40.

Subsequently, as shown in FIG. 41, a resist film FR is formed on the interlayer insulating film (base film) IL. Thereafter, the lithography technique according to the third embodiment is applied. More specifically, the present invention is applied to the formation of contact hole patterns shown in FIG. 34 based on the lithography technique in which EUV light is used and an exposure optical system in which the EUV light is obliquely incident on the mask is used.

Figure 42:
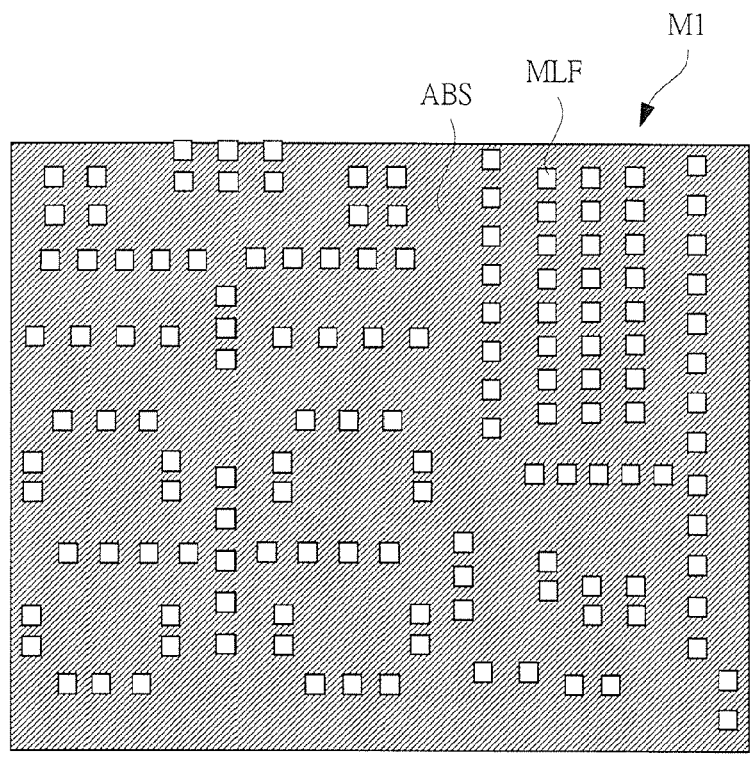
FIG. 42 is a diagram showing a conventional mask used to form contact holes.

FIG. 42 is a diagram showing a conventional mask M1 used to form the contact holes shown in FIG. 34. As shown in FIG. 42, a number of contact hole patterns are formed in the absorber ABS formed on the multilayer film MLF in the conventional mask M1. These contact hole patterns are distributed at various densities depending on the positions and directions. This mask M1 is a mask corresponding to the comparative example 1 shown in FIG. 27A of the second embodiment. Therefore, as described in the second embodiment, the contrast of the projection image with respect to the high-density contact hole patterns is decreased, and the resolution performance is reduced. As a result, the dimensional accuracy of the pattern transferred onto the semiconductor substrate 1S (resist film FR) is decreased.

Figure 43:
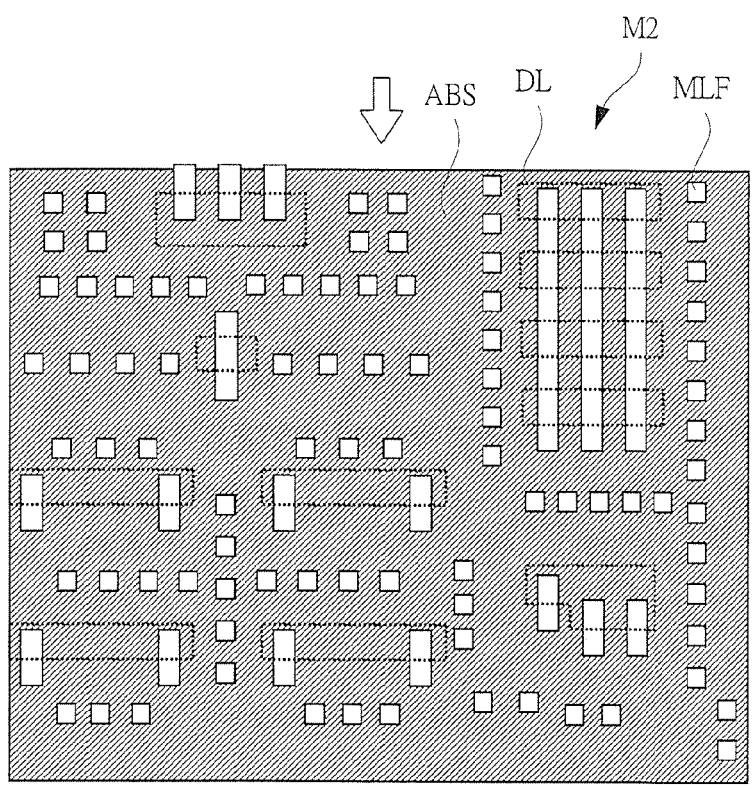
FIG. 43 is a diagram showing the mask according to the third embodiment.

For its solution, in the third embodiment, the mask is replaced with the mask M2 of the present invention shown in FIG. 43. More specifically, FIG. 43 is a diagram showing the mask M2 according to the third embodiment. As shown in FIG. 43, in the mask M2, the phase shift pattern by the difference in level DL is provided for the formation of the high-density contact hole patterns, in which adjacent contact holes are arranged at a short interval. More specifically, in addition to providing the contact hole patterns in the absorber ABS, the difference in level DL for giving the phase difference is provided for the region where the contact holes are densely formed. Since the dark portion is projected along the outline of the difference in level DL, it is not always necessary to dispose the absorber ABS between the adjacent contact hole patterns. As a result, the part where the eight contact hole patterns are densely arranged can be replaced with one opening pattern. Similarly, for example, two contact hole patterns can be replaced with one opening pattern. As described above, according to the third embodiment, even when the opening portion formed in the absorber ABS is an opening portion extending in one direction, a number of contact hole patterns arranged densely can be formed by providing the phase shift pattern by the difference in level DL.

The outline of the difference in level DL forms a closed figure, and the dark portion is ordinarily projected along the entire closed outline. However, in the third embodiment, the difference in level other than that forming the contact hole patterns is covered with the absorber ABS as shown in FIG. 43, and therefore, the dark portion is not projected from the covered unnecessary difference in level. Further, in the third embodiment, the arrangement and the outline of the difference in level DL for giving the phase difference are appropriately designed and disposed in accordance with the arrangement and the density of the contact holes to be transferred.

In the mask M2 as described above, the absorber ABS and the difference in level DL are formed, and further, the projective component (direction shown by arrow in FIG. 43) projected on the mask surface out of the direction cosine component of the incident light is set to be almost orthogonal to the extending direction of the difference in level DL. By this means, the formation of the shadow region caused by the absorber ABS can be suppressed in the whole region of the mask. More specifically, the technical idea of the third embodiment is characterized in that the dark portion extending in the direction intersecting with the projection direction of the incident light is formed by the difference in level DL instead of the absorber ABS. Since the absorber ABS with large height can be replaced with the difference in level DL whose height is almost negligible, the formation of the shadow region can be suppressed. As a result, in the lithography technique in which the EUV light is used and the exposure optical system in which the EUV light is obliquely incident on the mask is used, the contrast of the projection image can be improved, and as a result, the maximum resolution performance can be achieved (see FIG. 29C of the second embodiment described above). Accordingly, the dimensional accuracy of the pattern transferred onto the semiconductor substrate (resist film) can be improved.

Figure 44:
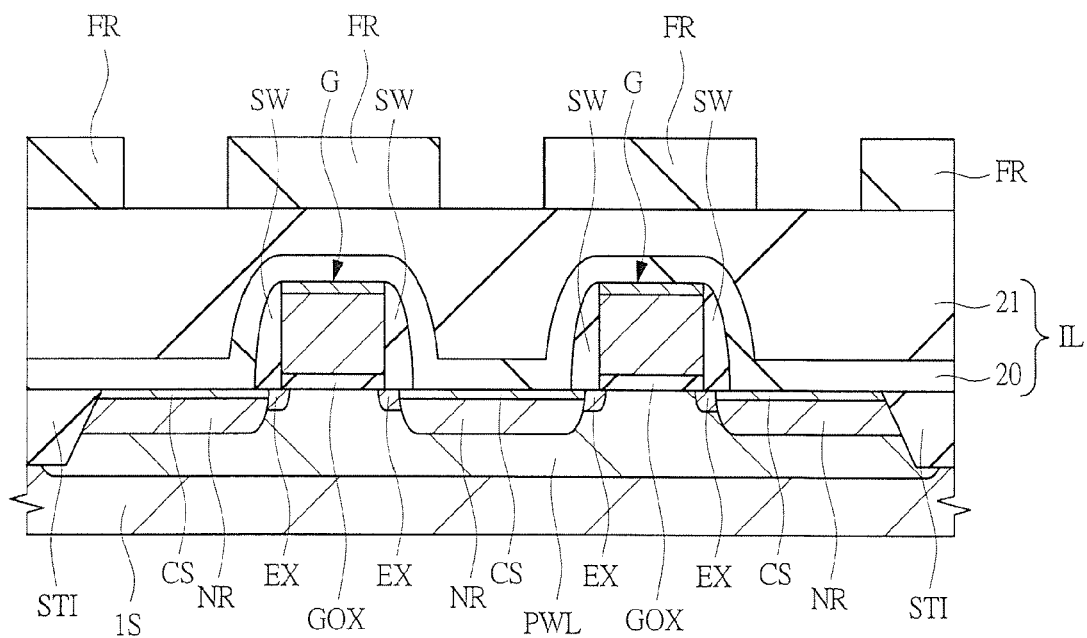
FIG. 44 is a cross-sectional view showing the manufacturing process of the semiconductor device continued from FIG. 41.
Figure 45:
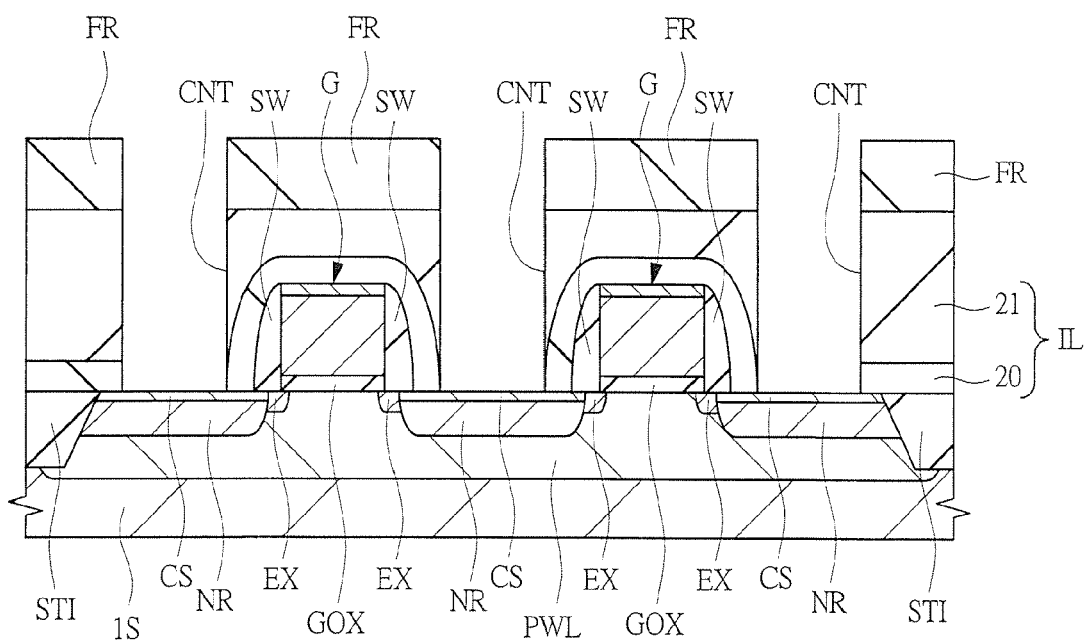
FIG. 45 is a cross-sectional view showing the manufacturing process of the semiconductor device continued from FIG. 44.

After performing the exposure method as described above, the development process is performed. By this means, as shown in FIG. 44, the resist film FR is patterned. Then, as shown in FIG. 45, the contact holes CNT are formed by the etching using the patterned resist film FR as a mask. Specifically, the interlayer insulating film IL to be a base film is etched with using the patterned resist film FR as a mask, so that the contact holes CNT that penetrate through the interlayer insulating film IL and reach the source region and the drain region are formed.

Figure 46:
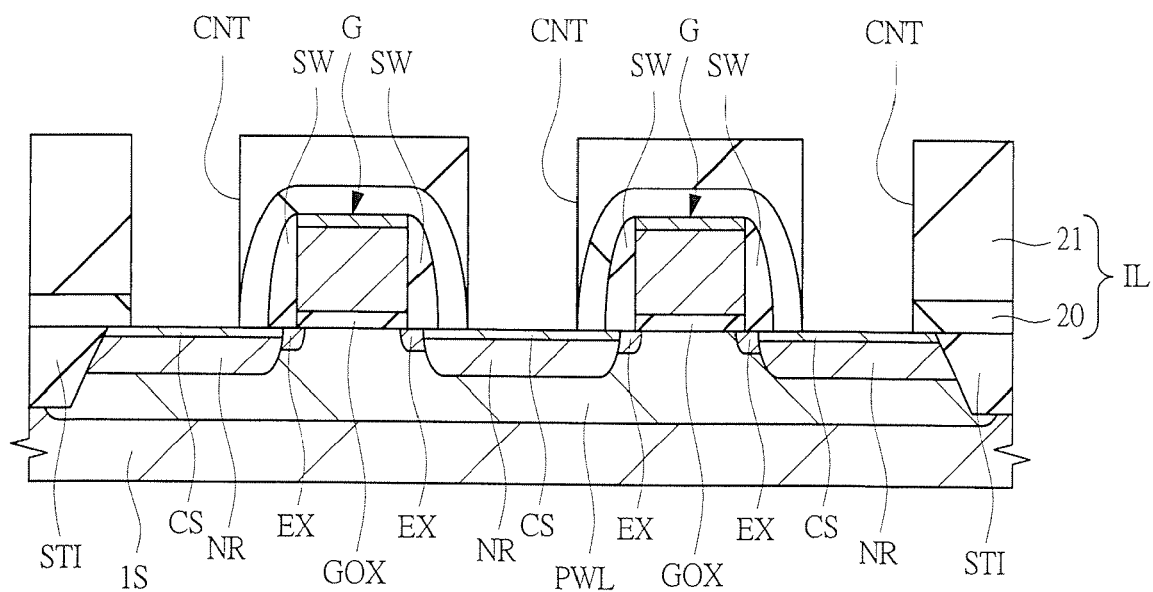
FIG. 46 is a cross-sectional view showing the manufacturing process of the semiconductor device continued from FIG. 45.
Figure 47:
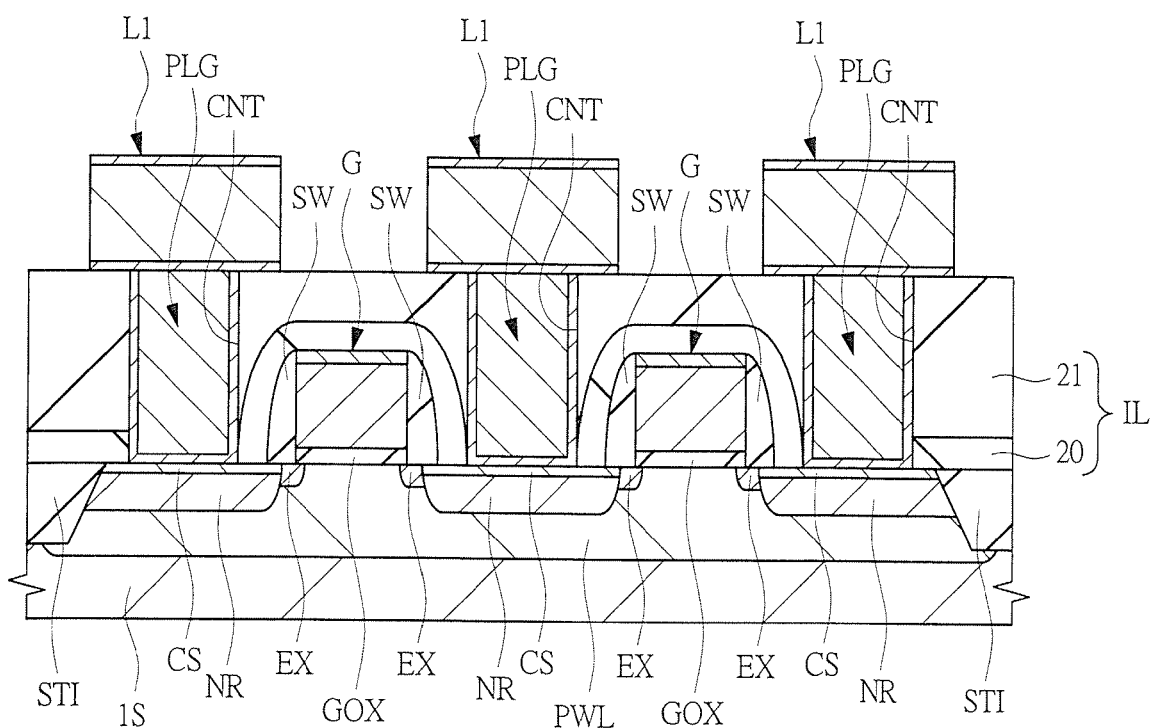
FIG. 47 is a cross-sectional view showing the manufacturing process of the semiconductor device continued from FIG. 46.

Subsequently, as shown in FIG. 46, the patterned resist film FR is removed. Then, as shown in FIG. 47, a titanium/titanium nitride film is formed on the silicon oxide film 21 including the bottom surface and the inner wall of the contact holes CNT. The titanium/titanium nitride film is constituted of a stacked film of a titanium film and a titanium nitride film and can be formed by using, for example, the sputtering method. This titanium/titanium nitride film has the so-called barrier properties for preventing the tungsten which is a material of the film to be filled in the subsequent process from diffusing in the silicon.

Subsequently, a tungsten film is formed on the main surface of the semiconductor substrate 1S so as to fill the contact holes CNT. This tungsten film can be formed by using, for example, the CVD method. Then, the unnecessary titanium/titanium nitride film and tungsten film formed on the silicon oxide film 21 are removed by using the CMP method, whereby the plugs PLG can be formed.

Thereafter, a titanium/titanium nitride film, an aluminum film containing copper and a titanium/titanium nitride film are sequentially formed on the interlayer insulating film IL and the plugs PLG. These films can be formed by using, for example, the sputtering method. Subsequently, these films are patterned by using the photolithography technique and the etching technique, thereby forming the wiring L1. Although the multilayer wiring is further formed on the wiring L1, the description thereof is omitted here. In this manner, the semiconductor device according to the third embodiment can be finally formed.

As described above, when the pattern formation method according to the third embodiment is adopted, a large number of hole patterns having different arrangement and density can be simultaneously transferred with high accuracy. In other words, since the pattern transfer using the highly reliable mask can be performed, the performance, reliability and yield of the manufactured semiconductor device can be improved. As a result, it contributes to the cost reduction of the semiconductor device.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be widely used in the semiconductor device manufacturing industry.

What is claimed is:

1. A manufacturing method of a semiconductor device comprising the steps of:
   (a) forming a base film on a semiconductor substrate;
   (b) forming a resist film on the base film;
   (c) patterning the resist film; and
   (d) patterning the base film by using the patterned resist film,
   wherein the step (c) includes:
   (c1) a step of making extreme ultra violet light be incident on an illumination optical system and making the extreme ultra violet light from the illumination optical system be incident obliquely on a mask having a pattern formed thereon; and
   (c2) a step of making extreme ultra violet light reflected obliquely from the mask be incident on an imaging optical system, and irradiating the extreme ultra violet light from the imaging optical system on the resist film formed on the semiconductor substrate,
   the mask including:
   a mask substrate having a first region and a second region;
   a multilayer film formed in the first region and the second region of the mask substrate, the multilayer film reflecting the extreme ultra violet light; and
   an absorber formed on the multilayer film so as to extend, in plan view, in a first direction, the absorber absorbing the extreme ultra violet light,
   the mask having a difference in level extending, in plan view, in a second direction in a boundary between the multilayer film formed in the first region and the multilayer film formed in the second region, the first direction intersecting the second direction,
   wherein after the extreme ultra violet light is reflected from the mask on which the pattern including the difference in level and the absorber is formed, the extreme ultra violet light is irradiated on the resist film, thereby patterning the resist film so as to correspond to the pattern formed on the mask, and
   wherein a direction of a projective component projected on a mask surface out of a direction cosine component of a ray direction of the extreme ultra violet light incident obliquely on the mask is substantially parallel with the first direction in which the absorber extends.

2. The manufacturing method of a semiconductor device according to claim 1,
   wherein a height of the difference in level is one quarter of a wavelength of the extreme ultra violet light.

3. The manufacturing method of a semiconductor device according to claim 2,
   wherein the wavelength of the extreme ultra violet light is 12 nm or longer and 15 nm or shorter.

4. The manufacturing method of a semiconductor device according to claim 1,
   wherein the difference in level is formed between the first region and the second region of the mask substrate.

5. The manufacturing method of a semiconductor device according to claim 4,
   wherein a groove engraved in the mask substrate is formed in the second region of the mask substrate, and the difference in level is formed in the boundary between the first region and the second region of the mask substrate by the groove formed in the second region.

6. The manufacturing method of a semiconductor device according to claim 4,
   wherein a thin film is formed between the mask substrate and the multilayer film only in the first region of the mask substrate, and the difference in level corresponding to a thickness of the thin film is formed in the boundary between the first region and the second region.

7. The manufacturing method of a semiconductor device according to claim 1,
   wherein the resist film is patterned so as to correspond to a pattern obtained by combining a first transfer pattern formed by the absorber on the mask and a second transfer pattern formed by an outline of the difference in level.

8. The manufacturing method of a semiconductor device according to claim 1,
wherein a plurality of absorbers are formed on the mask, and the plurality of absorbers extend in the first direction and form line patterns arranged in the second direction intersecting with the first direction, and
the difference in level is formed so as to intersect with the line patterns and so as to extend in the second direction.

9. The manufacturing method of a semiconductor device according to claim 8,
wherein the base film formed in step (a) is an interlayer insulating film formed so as to cover a MISFET formed on the semiconductor substrate, and
step (d) is a step of forming a plurality of hole patterns in the interlayer insulating film.

10. The manufacturing method of a semiconductor device according to claim 8,
wherein the direction of the projective component projected on the mask surface is set to be parallel to the first direction in which the absorber extends.

11. The manufacturing method of a semiconductor device according to claim 1,
wherein the direction of the projective component projected on the mask surface is set to be orthogonal to the second direction in which the difference in level extends.

12. The manufacturing method of a semiconductor device according to claim 1,
wherein an illumination light source delivering the extreme ultra violet light is a light source which realizes a modified illumination formed of a pair of light sources arranged separately by a predetermined distance in the second direction in which the difference in level extends.

13. The manufacturing method of a semiconductor device according to claim 1,
wherein the multilayer film formed on the mask substrate is a film obtained by repeatedly stacking a stacked film including a silicon layer and a molybdenum layer.

14. The manufacturing method of a semiconductor device according to claim 1,
wherein the direction of the projective component projected on a mask surface is substantially orthogonal to the second direction in which the difference in level extends.

\* \* \* \* \*